United States Patent
Zhai et al.

(10) Patent No.: US 11,455,944 B2
(45) Date of Patent: Sep. 27, 2022

(54) DISPLAY PANEL INCLUDING AT LEAST ONE POWER SUPPLY STRUCTURE INCLUDING COMMON ELECTRODE CONFIGURED TO HAVE PREDETERMINED AREA, AND DISPLAY DEVICE

(71) Applicant: Hubei Yangtze Industrial Innovation Center Of Advanced Display Co., Ltd., Wuhan (CN)

(72) Inventors: Yingteng Zhai, Shanghai (CN); Jujian Fu, Shanghai (CN); Tianyi Wu, Shanghai (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 0 days.

(21) Appl. No.: 17/206,897

(22) Filed: Mar. 19, 2021

(65) Prior Publication Data

US 2021/0210004 A1    Jul. 8, 2021

(30) Foreign Application Priority Data

Dec. 2, 2020    (CN) .......................... 202011400056.8

(51) Int. Cl.
*G09G 3/32* (2016.01)
*H01L 25/075* (2006.01)
(Continued)

(52) U.S. Cl.
CPC ........... *G09G 3/32* (2013.01); *H01L 25/0753* (2013.01); *H01L 27/1214* (2013.01);
(Continued)

(58) Field of Classification Search
CPC ............. G09G 3/32; G09G 2300/0426; G09G 2300/0443; G09G 2310/0267;
(Continued)

(56) References Cited

U.S. PATENT DOCUMENTS

2015/0228865 A1    8/2015  Rhee
2017/0365808 A1*  12/2017  Lee ..................... H01L 27/3276
(Continued)

FOREIGN PATENT DOCUMENTS

| CN | 108022940 A | 5/2018 |
| CN | 109087922 A | 12/2018 |
| CN | 110060582 A | 7/2019 |

OTHER PUBLICATIONS

State Intellectual Property Office of the People's Republic of China, First Office Action, Chinese Application No. 202011400056.8, dated Apr. 13, 2022.

*Primary Examiner* — Kwang-Su Yang
(74) *Attorney, Agent, or Firm* — Christensen O'Connor Johnson Kindness PLLC

(57) ABSTRACT

A display panel and a display device are provided. The display panel includes an array substrate and a pixel array. The pixel array includes a plurality of subpixels, each of which includes at least one light-emitting diode that includes a first electrode and a second electrode. The array substrate includes a first power supply structure, a second power supply structure, and a plurality of pixel circuits. The first power supply structure is electrically connected to the first electrode of the light-emitting diode by the pixel circuits, and the second power supply structure is electrically connected to the second electrode of the light-emitting diode. At least one of the first power supply structure and the second power supply structure includes at least one common electrode.

20 Claims, 11 Drawing Sheets

(51) Int. Cl.
  *H01L 27/12* (2006.01)
  *H01L 33/62* (2010.01)
(52) U.S. Cl.
  CPC ..... *H01L 33/62* (2013.01); *G09G 2300/0426* (2013.01); *G09G 2300/0443* (2013.01); *G09G 2310/0267* (2013.01); *G09G 2310/0275* (2013.01); *G09G 2330/021* (2013.01)
(58) Field of Classification Search
  CPC ...... G09G 2310/0275; G09G 2330/021; H01L 25/0753; H01L 27/1214; H01L 33/62
  See application file for complete search history.

(56) References Cited

U.S. PATENT DOCUMENTS

| | | | |
|---|---|---|---|
| 2018/0122836 A1* | 5/2018 | Kang | H01L 33/08 |
| 2020/0126875 A1* | 4/2020 | Chang | H01L 33/62 |
| 2020/0185489 A1* | 6/2020 | Jo | H01L 27/3279 |
| 2020/0243600 A1* | 7/2020 | Tzeng | H01L 23/544 |
| 2020/0411560 A1* | 12/2020 | Kao | H01L 27/0296 |
| 2022/0020831 A1* | 1/2022 | Jeon | H01L 51/56 |

\* cited by examiner

US 11,455,944 B2

DISPLAY PANEL INCLUDING AT LEAST ONE POWER SUPPLY STRUCTURE INCLUDING COMMON ELECTRODE CONFIGURED TO HAVE PREDETERMINED AREA, AND DISPLAY DEVICE

CROSS-REFERENCE TO RELATED APPLICATIONS

The present application is based upon and claims priority to Chinese Patent Application No. 202011400056.8, filed on Dec. 2, 2020, the content of which is incorporated herein by reference in its entirety.

TECHNICAL FIELD

The present disclosure relates to the field of display technology, and in particular, to a display panel and a display device.

BACKGROUND

In current display panel in which a light-emitting diode is used as a light-emitting pixel, it is necessary to provide a positive power supply line and a negative power supply line to supply power to the light-emitting diode. A significant voltage drop across the power supply line is generated during displaying, which not only results in excessive power consumption loss of the display panel, but also generates uneven display. Accordingly, display panels with reduced power consumption are still needed.

SUMMARY

At least one of embodiments of the present disclosure provides a display panel and a display device, which can reduce power consumption loss of the display panel while improving uneven display due to a voltage drop across power supply lines.

A first aspect of the present disclosure provides a display panel including an array substrate and a pixel array. The pixel array includes a plurality of subpixels, each of which includes at least one light-emitting diode that includes a first electrode and a second electrode. The array substrate includes a first power supply structure configured to provide a first power supply voltage, a second power supply structure configured to provide a second power supply voltage, and a plurality of pixel circuits. The first power supply structure is electrically connected to the first electrode of the at least one light-emitting diode by the plurality of pixel circuits, and the second power supply structure is electrically connected to the second electrode of the at least one light-emitting diode. At least one of the first power supply structure and the second power supply structure includes at least one common electrode. The display panel further includes a display region having an area of $S_0$, an area of a projection of a portion of the at least one common electrode in the display region on a plane of the display panel is defined as $S_1$, where $S_1 \geq 0.5 S_0$.

A second aspect of the present disclosure provides a display device including the display panel according to any embodiments of the present disclosure.

In the display panel and the display device according to various embodiments of the present disclosure, at least one power supply structure includes the common electrode configured to have a predetermined area. Accordingly, a resistance of the power supply structure can be reduced, thereby reducing the voltage drop of signal transmission over the power supply structure and power consumption loss of the power supply structure while improving uneven display, when driving the light emitting diode to emit light.

BRIEF DESCRIPTION OF DRAWINGS

In order to explain the technical solutions of some embodiments of the present disclosure or the related art, the accompanying drawings referred in the description of some embodiments of the present disclosure or the related art will be briefly introduced. These drawings in the following description illustrate some embodiments of the present disclosure. Other drawings may be obtained by those skilled in the art based on these drawings.

DETAILED DESCRIPTION

Embodiments of the disclosure will be clearly and completely described hereinafter with reference to the accompanying drawings in some embodiments of the present disclosure in order to make objections, technical solutions and advantages of some embodiments of the present disclosure clearer. It should be understood that the embodiments described below are merely some of, rather than all of the embodiments of the present disclosure. Based on the embodiments of the present disclosure, all other embodiments made by those skilled in the art shall fall within the scope of the present disclosure.

The terms used in the embodiments of the present disclosure are merely for the purpose of describing specific embodiments, but are not intended to limit the present disclosure. The singular forms of "a", "said" and "the" used in the embodiments of the present disclosure and the appended claims are also intended to include plural forms, unless otherwise stated.

At least one of the embodiments of the present disclosure provides a display panel and a display device. A power supply structure for driving a light-emitting diode is modified, such that at least one power supply structure includes a common electrode configured to have a predetermined area, so as to reduce a voltage drop of signal transmission over the power supply structure and power consumption loss of the power supply structure while improving uneven display when driving the light-emitting diode to emit light.

Figure 1:
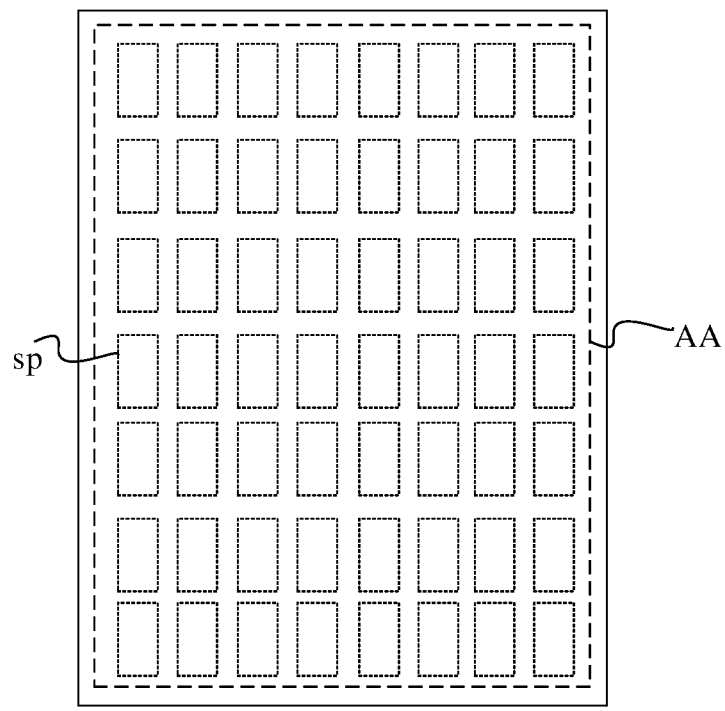
FIG. 1 is a schematic top view of a display panel according to an embodiment of the present disclosure.
Figure 2:
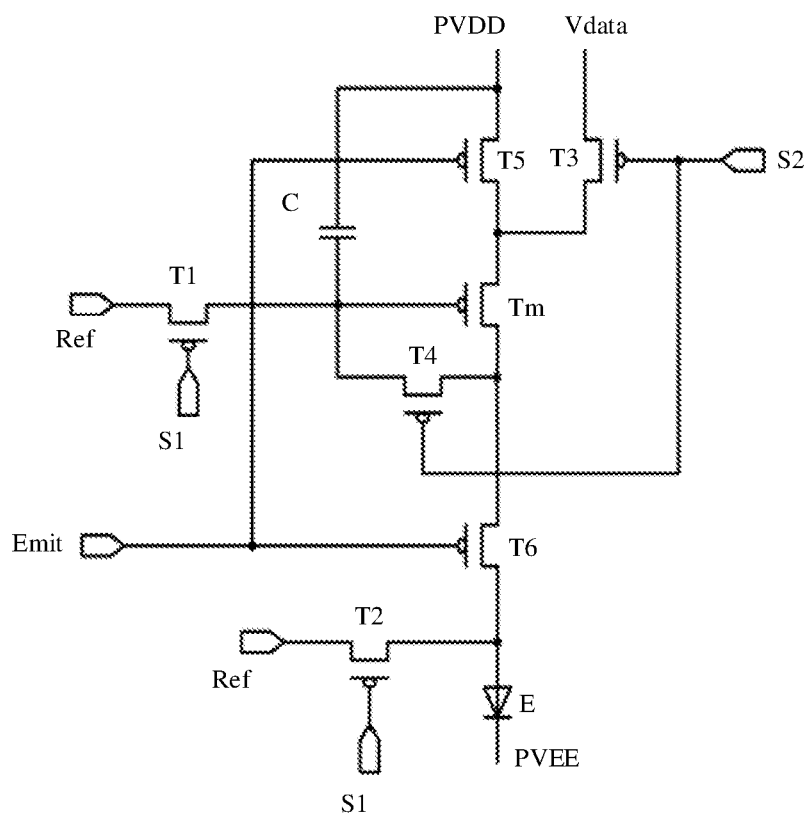
FIG. 2 is a schematic structural view of a pixel circuit of a display panel according to an embodiment of the present disclosure.

FIG. 1 shows a schematic top view of a display panel according to an embodiment of the present disclosure, and FIG. 2 shows a schematic structural view of a pixel circuit of a display panel according to an embodiment of the present disclosure.

As shown in FIG. 1, the display panel includes a display region AA including a pixel array that includes a plurality of subpixels sp. One of the subpixels sp includes at least one light-emitting diode including a first electrode and a second electrode.

The display panel according to an embodiment of the present disclosure further includes an array substrate including a first power supply structure, a second power supply structure, and a plurality of pixel circuits. The first power supply structure is configured to provide a first power supply voltage, and the second power supply structure is configured to provide a second power supply voltage. The first power supply structure is electrically connected to the first electrode of the light-emitting diode by the pixel circuits, and the second power supply structure is electrically connected to the second electrode of the light-emitting diode. The first power supply structure, the second power supply structure and the pixel circuits cooperate with each other to drive the light-emitting diode to emit light. FIG. 2 only illustrates an alternative structure of the pixel circuit, and the present disclosure is not intended to be limited thereto. FIG. 2 illustrates a 7T1C pixel circuit including a driving transistor Tm, 6 switching transistors (T1 to T6) and a pixel capacitor C. A positive power supply voltage terminal PVDD, a negative power supply voltage terminal PVEE, a data voltage terminal Vdata, a first scan voltage terminal S1, a second scan voltage terminal S2, a reset power terminal Vref, and a light emission control terminal Emit are also shown in FIG. 2. One of the electrodes of the light-emitting diode E is connected to the positive power supply voltage terminal PVDD by the pixel circuit, and the other of the electrodes of the light-emitting diode E is connected to the negative power supply voltage terminal PVEE. The positive power supply voltage terminal PVDD is configured to provide a positive power supply voltage signal, and the negative power supply voltage terminal PVEE is configured to provide a negative power supply voltage signal.

In some embodiments of the present disclosure, one of the first power supply structure and the second power supply structure is configured to provide the positive power supply voltage terminal, and the other structure is configured to provide the negative power supply voltage terminal. That is, one of the first power supply structure and the second power supply structure is configured to provide the positive power supply voltage signal, and the other structure is configured to provide the negative power supply voltage signal. In some embodiments of the present disclosure, at least one of the first power supply structure and the second power supply structure is designed to include at least one common electrode. The display panel further includes a display region having an area $S_0$, and an area of an orthographic projection of a portion of the common electrode in the display region onto a plane of the display panel is defined as $S_1$, where $S_1 \geq 0.5 S_0$. The common electrode is configured to reduce a resistance of the power supply structure, thereby reducing a voltage drop of a signal transmission over the power supply structure and power consumption loss of the power supply structure while improving uneven display.

In some embodiments of the present disclosure, the common electrode may be in a strip shape or a block shape, and the common electrode may be formed with an opening. In some embodiments of the present disclosure, the common electrode further includes at least two sub-common electrodes overlapped with each other. When calculating the area $S_1$, a total area of orthographic projections of portions of the common electrodes in the display region on the plane of the display panel is calculated, and an area of the opening is subtracted from the total area during the calculation. For the common electrode including the sub-common electrodes overlapped with each other, an area of an overlapping portion of the sub-common electrodes overlapped with each other is not repeatedly calculated in a direction perpendicular to the plane where the display panel is located.

In an embodiment, $S_1=0.6 S_0$. In another embodiment, $S_1=0.7 S_0$. In some embodiments, $S_1=0.9 S_0$. The larger $S_1$ becomes, the less the overall resistance of the common electrode becomes, which is more beneficial to reduce power consumption loss of the power supply structure while improving uneven display.

In some embodiments, the first power supply structure is configured to provide the first power supply voltage, and the second power supply structure is configured to provide the second power supply voltage which is lower than the first power supply voltage. Alternatively, the first power supply voltage has a voltage within a range of 0 to 8V (including endpoint values), and the second power supply voltage has a voltage within a range of 0 to −8V (including endpoint values).

In some embodiments, only one of the power supply structures includes a common electrode. In some embodiments, each of the first power supply structure and the second power supply structure includes a common electrode. The common electrode may be in a whole surface shape, or a strip shape or a block shape. In the display panel, each of the first electrode and the second electrode of the light-emitting diode may be arranged to face towards the pixel circuit. Alternatively, each of the first electrode and the second electrode of the light-emitting diode may be arranged to face away from the pixel circuit. Additionally and alternatively, one of the first electrode and the second electrode of the light-emitting diode may be arranged to face towards the pixel circuit, and the other electrode may be arranged to face away from the pixel circuit. In a case where the first electrode of the light-emitting diode is disposed at a different position from the second electrode relative to the pixel circuit, the first power supply structure may be arranged at a different position from the second power supply structure. The present disclosure will be explained in detail below with reference to some specific embodiments.

Figure 3:
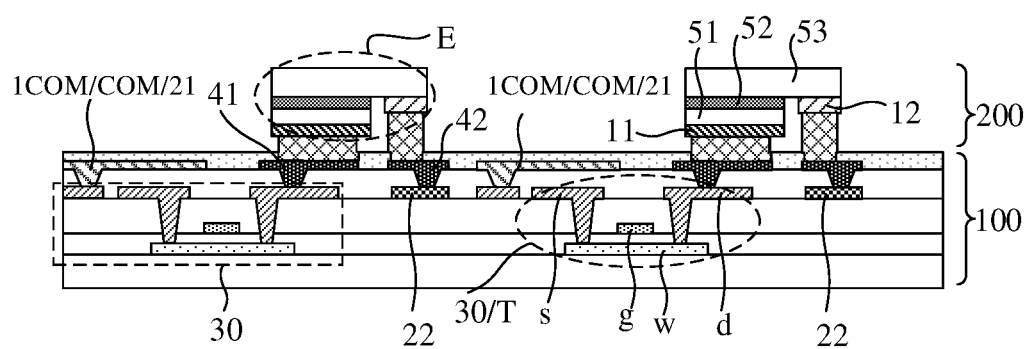
FIG. 3 is a schematic sectional view of a display panel according to an embodiment of the present disclosure.

In an embodiment, the first electrode and the second electrode of the light-emitting diode are both arranged to face towards the pixel circuit. FIG. 3 shows a schematic sectional view of a display panel according to an embodiment of the present disclosure, in which an array substrate 100 and a pixel array 200 are shown. Each of a plurality of light-emitting diodes E further includes a first semiconductor layer 51, a quantum well layer 52 and a second semiconductor layer 53 laminated to each other. The quantum well layer 52 is arranged between the first semiconductor layer 51 and the second semiconductor layer 53. The first electrode 11 is connected to the first semiconductor layer 51, and the second electrode 12 is connected to the second semiconductor layer 53. The first semiconductor layer 51 is arranged at a side of the second semiconductor layer 53 close to a plurality of pixel circuits 30. Further, the first electrode 11 is arranged at a side of the first semiconductor layer 51 close to the pixel circuit 30, and the second electrode 12 is arranged at the side of the second semiconductor layer 53 close to the pixel circuit 30. FIG. 3 also illustrates a first power supply structure 21 and a second power supply structure 22. The first power supply structure 21 is electrically connected to the first electrode 11 of the light-emitting diode E by the pixel circuit 30, and the second power supply structure 22 is electrically connected to the second electrode 12 of the light-emitting diode E.

Figure 4:
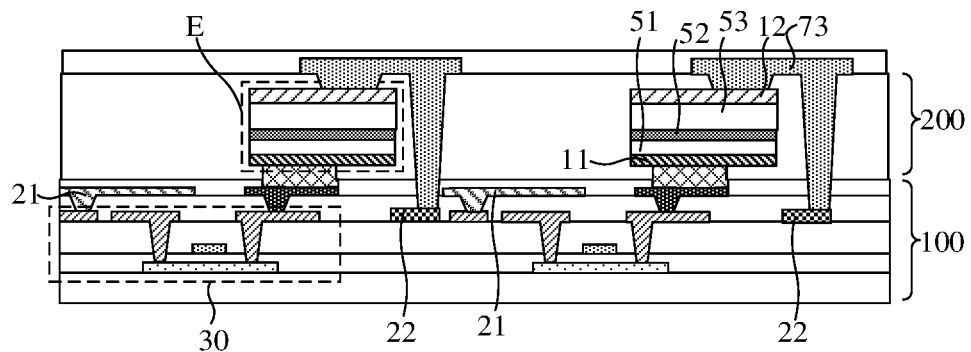
FIG. 4 is a schematic sectional view of another display panel according to an embodiment of the present disclosure.

In an alternative embodiment, one of the first electrode and the second electrode of each light-emitting diode is arranged to face towards the pixel circuit, and the other electrode is arranged to face away from the pixel circuit. FIG. 4 shows a schematic sectional view of another display panel according to an embodiment of the present disclosure. As shown in FIG. 4, the first semiconductor layer 51 is arranged at the side of the second semiconductor layer 53 close to the pixel circuit 30. Further, the first electrode 11 is arranged at the side of the first semiconductor layer 51 close to the pixel circuit 30, and the second electrode 12 is arranged at a side of the second semiconductor layer 53 away from the pixel circuit 30. FIG. 4 also illustrates the first power supply structure 21 and the second power supply structure 22. The first power supply structure 21 is electrically connected to the first electrode 11 of the light-emitting diode E by the pixel circuit 30, and the second power supply structure 22 is electrically connected to the second electrode 12 of the light-emitting diode E. As show in FIG. 4, the second electrode is electrically connected to the second power supply structure 22 by a conductive connection structure 73.

Figure 5:
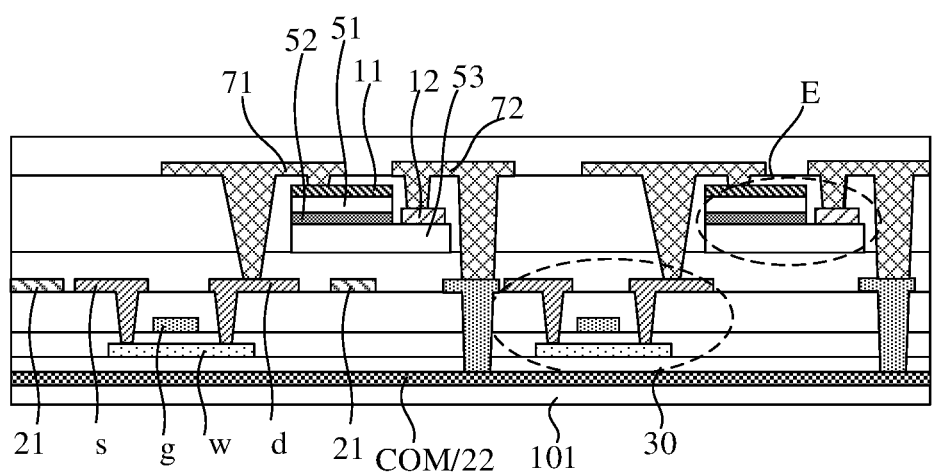
FIG. 5 is a schematic sectional view of another display panel according to an embodiment of the present disclosure.

In an alternative embodiment, the first electrode and the second electrode of the light-emitting diode are both arranged to face away from the pixel circuit. FIG. 5 shows a schematic sectional view of another display panel according to an embodiment of the present disclosure. As shown in FIG. 5, the first semiconductor layer 51 is arranged at a side of the second semiconductor layer 53 away from the pixel circuit 30. Further, the first electrode 11 is arranged at a side of the first semiconductor layer 51 away from the pixel circuit 30, and the second electrode 12 is arranged at the side of the semiconductor layer 53 away from the pixel circuit 30. The first power supply structure 21 is electrically connected to the first electrode 11 of the light-emitting diode E by the pixel circuit 30, and the second power supply structure 22 is electrically connected to the second electrode 12 of the light-emitting diode E.

In an embodiment, the common electrode is disposed in the whole display region. Specifically, as shown in FIG. 5, the second power supply structure 22 includes a common electrode COM disposed in the whole display region. That is, the common electrode COM is electrically connected to the second electrodes 12 of all of the light-emitting diodes E in the display region. Further, only one transistor of the pixel circuit 30 is schematically shown, and the transistor includes a first electrode d, a second electrode s, a control electrode g and an active layer w. Alternatively, the second electrode s may be configured to be a source electrode, the first electrode d may be configured to be a drain electrode, and the control electrode g may be configured to be a gate electrode. In the illustrated embodiment, the first power supply structure 21 is arranged in the same layer as the second electrode s and the first electrode d of the transistor. In this embodiment, the second power supply structure includes the common electrode disposed in the whole display region, a resistance of the second power supply structure can be thus reduced, thereby reducing a voltage drop of signal transmission over the second power supply structure and power consumption loss of the second power supply structure while improving uneven display.

Specifically, with reference to FIG. 5 again, the array substrate further includes a substrate 101 arranged at a side of the pixel circuit 30 away from the light-emitting diode E. The common electrode COM is arranged between the substrate 101 and the pixel circuit 30. Further, the pixel circuit is electrically connected to the first electrode 11 by a first conductive connection structure 71. The second electrode 12 is electrically connected to the common electrode COM by a second conductive connection structure 72. In the illustrated embodiment, the common electrode of the second power supply structure can be disposed in the whole display region.

In an embodiment, the common electrode is a strip electrode, and the pixel array of the display panel includes a plurality of subpixel rows extending in a first direction and a plurality of subpixel columns extending in a second direction. The second direction is intersected with, typically perpendicular to, the first direction. The common electrode includes a plurality of strip electrodes extending in the first direction and arranged in the second direction in the display region.

In an alternative embodiment, the common electrode may include a plurality of strip electrodes extending in the second direction and arranged in the first direction in the display region.

Alternatively, one of the strip electrodes corresponds to one of the subpixel rows, or the one strip electrode corresponds to one of the subpixel columns.

In an alternative embodiment, one of the strip electrodes may correspond to two or three of the subpixel rows, or the one strip electrode may correspond to two or three of the subpixel columns. Further, when the strip electrode is disposed between the pixel circuit and the pixel array, the strip electrode is provided with an opening in which an auxiliary electrode is disposed. The auxiliary electrode is configured to achieve electrical connection between the power supply structures and the electrodes of the light-emitting diodes and electrical connection between the electrodes of the light-emitting diodes and the pixel circuits.

In an alternative embodiment, the common electrode may be a block electrode, and the block electrode may correspond to a plurality of subpixel rows, or the block electrode may correspond to a plurality of subpixel columns. When the block electrode is disposed between the pixel circuit and the pixel array, the block electrode is provided with an opening in which an auxiliary electrode is disposed. The auxiliary electrode is configured to achieve electrical connection between the power supply structures and the electrodes of the light-emitting diodes and electrical connection between the electrodes of the light-emitting diodes and the pixel circuits.

In an alternative embodiment, the common electrode may correspond to all the subpixels in the display region and may be provided with a plurality of openings. Similarly, auxiliary electrodes may be disposed in the openings. The auxiliary electrodes are configured to achieve electrical connection between the power supply structures and the electrodes of the light-emitting diodes and electrical connection between the electrodes of the light-emitting diodes and the pixel circuits.

In some embodiments of the present disclosure, the common electrode of each of the first power supply structure and the second power supply structure may be designed as a strip electrode or a block electrode, thereby ensuring that the common electrode has a large area to reduce the resistance of the power supply structures. The specific structure of the common electrode will be described with reference to the following specific embodiments.

Specifically, with reference to FIG. 3 again, the first power supply structure 21 includes at least one common electrode as a first common electrode 1COM that is arranged at a side of the pixel circuit 30 close to the pixel array 200. The array substrate 100 further includes a plurality of first auxiliary electrodes 41 that are disposed in the same layer as the first common electrodes 1COM and insulated therefrom. Each pixel circuit 30 includes at least one transistor T that includes a first electrode d, a second electrode s, a control electrode g and an active layer w. The first electrode d of the transistor T is electrically connected to the first electrode 11 of the light-emitting diode E by the first auxiliary electrode 41. Specifically, the array substrate includes a gate metal layer, a source-drain metal layer and a semiconductor layer. The control electrode g is arranged in the gate metal layer, the first electrode d and the second electrode s are arranged in the source-drain metal layer, and the active layer w is arranged in the semiconductor layer. FIG. 3 schematically illustrates that the transistor has a top gate structure.

With reference to FIG. 3 again, the array substrate 100 further includes a plurality of second auxiliary electrodes 42 that are disposed in the same layer as the first common electrodes 1COM and insulated therefrom. The second power supply structure 22 is electrically connected to the second electrode 12 of the light-emitting diode E by the second auxiliary electrode 42. The second power supply structure 22 is disposed in the same layer as the first electrode d and the second electrode s of the transistor T. Alternatively, the second power supply structure 22 includes a plurality of second power supply lines, one of which is connected to the second electrodes of the plurality of light-emitting diodes. In the illustrated embodiment shown in FIG. 3, a position of the second power supply structure 22 is illustrative, and the present disclosure is not intended to be limited thereto.

FIG. 3 illustrates that the first power supply structure 21 is disposed between the pixel circuit 30 and the light-emitting diode E and includes the first common electrode. As described above, the projection area of the portion of the common electrode in the display region on the plane of the display panel is defined as $S_1$, where $S_1 \geqslant 0.5S_0$. In this embodiment, the first power supply structure includes the common electrode. Therefore, a resistance of the first power supply structure can be reduced, thereby reducing a voltage drop of signal transmission over the first power supply structure and power consumption loss of the first power supply structure while improving uneven display.

Further, with reference to FIG. 3 again, the second power supply structure 22 is arranged at a side of the first common electrode 1COM away from the light-emitting diode E. Further, the second power supply structure 22 includes a plurality of second power supply lines located in the same layer as the first electrode d of the transistor T. Data lines of the display panel are located in the same layer as the first electrode. Specifically, the second power supply lines and the date lines of the display panel extend in the same direction so as to ensure mutual insulation between the second power supply lines and the data lines. In this embodiment, the first power supply structure includes the common electrode, such that power consumption loss of the first power supply structure can be reduced while improving uneven display. The second power supply structure includes the second power supply lines located in the same layer as the first electrode of the transistor. Thus, the second power supply lines and the first electrode of the transistor can be manufactured in the same process, such that manufacture of the second power supply structure would not increase a thickness of a film layer of the display panel.

Figure 6:
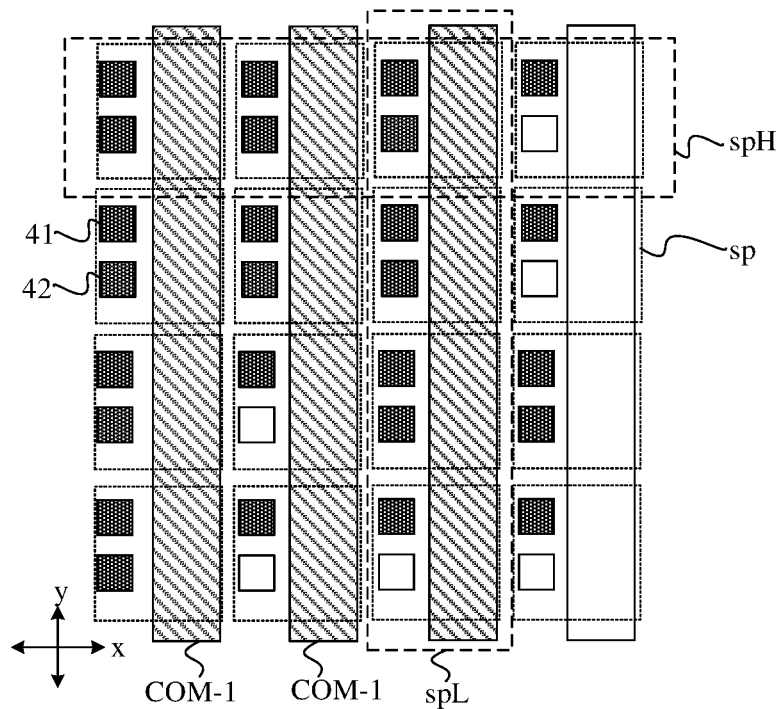
FIG. 6 is a schematic partial top view of the display panel shown in FIG. 3.

In an embodiment, the first common electrode shown in FIG. 3 is the strip electrode. FIG. 6 shows a schematic partial top view of the display panel shown in FIG. 3. FIG. 6 only illustrates a structure of a film layer where the subpixels and the first power supply structure are located. As shown in FIG. 6, the pixel array includes a plurality of subpixel rows spH extending in a first direction x and a plurality of subpixel columns spL extending in a second direction y. The second direction y is intersected with, typically perpendicularly to, the first direction x. Each of the subpixel rows spH includes a plurality of subpixels sp, and the common electrode COM includes a plurality of strip electrodes COM-1. The plurality of strip electrodes COM-1 extend in the second direction y and are arranged in the first direction x in the display region.

In an alternative embodiment, the plurality of strip electrodes COM-1 may extend in the first direction x and are arranged in the second direction y in the display region, and the details thereof will be omitted herein.

Figure 7:
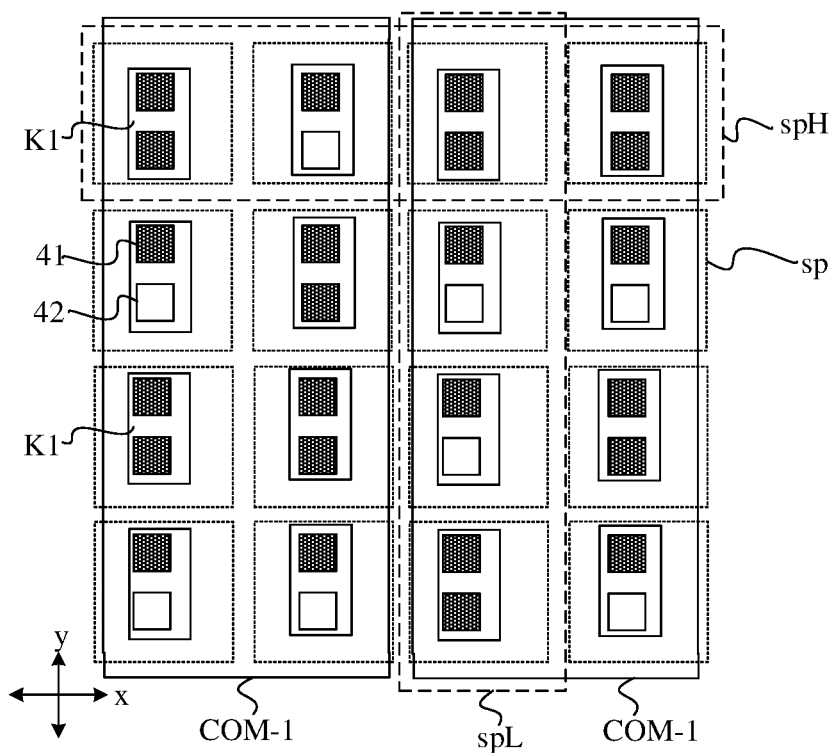
FIG. 7 is another schematic partial top view of the display panel shown in FIG. 3.

FIG. 6 illustrates that each strip electrode corresponds to a respective one of the plurality of subpixel columns. In an alternative embodiment, each strip electrode may correspond to two or more subpixel columns. FIG. 7 shows another schematic partial top view of the display panel shown in FIG. 3. FIG. 7 only illustrates a structure of a film layer where the subpixels and the first power supply structure are located. As shown in FIG. 7, the strip electrodes COM-1 extend in the second direction y and are arranged in the first direction x in the display region. Further, each strip electrode COM-1 corresponds to two subpixel columns spL. The strip electrode COM-1 has a plurality of first openings K1 penetrating through the strip electrode COM-1 in a thickness direction thereof. Each first opening K1 is provided with the first auxiliary electrode 41 and the second auxiliary electrode 42 therein. In this embodiment, the area of the first common electrode can be further increased, thereby further reducing the resistance of the first power supply structure, which in turn further reduces the voltage drop of signal transmission over the first power supply structure and power consumption loss of the first power supply structure while improving uneven display.

Figure 8:
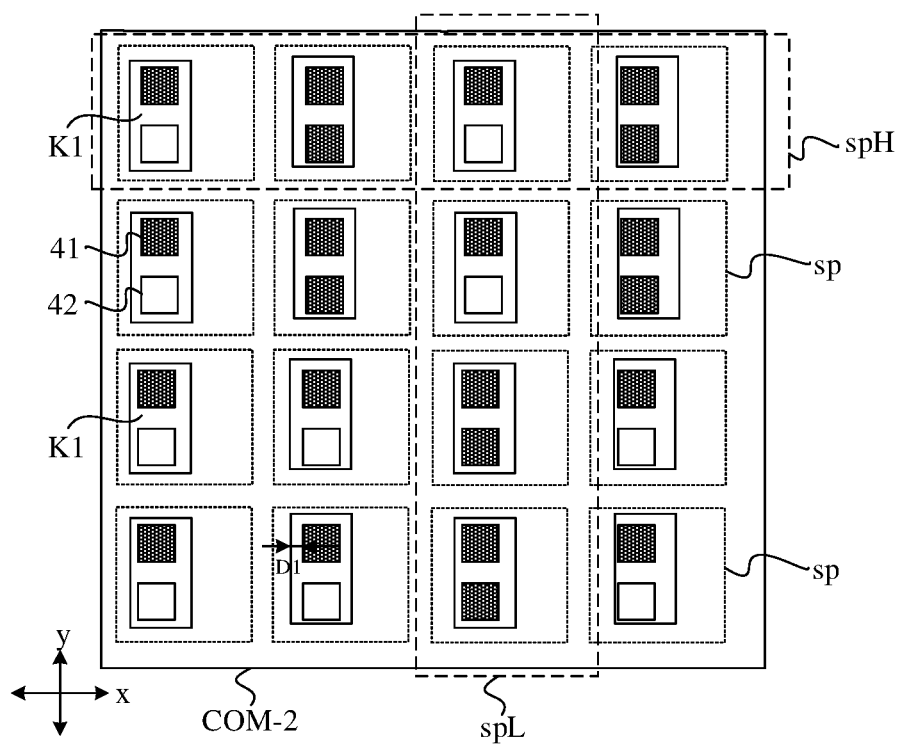
FIG. 8 is another schematic partial top view of the display panel shown in FIG. 3.

In an alternative embodiment, the first common electrode shown in FIG. 3 may be a block electrode. FIG. 8 shows another schematic partial top view of the display panel as shown in FIG. 3. FIG. 8 only illustrates a structure of a film layer where the subpixels and the first power supply structure are located. As shown in FIG. 8, the first common electrode is a block electrode COM-2 corresponding to the plurality of subpixel rows spH and the plurality of subpixel columns spL. The block electrode COM-2 has a plurality of first openings K1 penetrating through the block electrode COM-2 in a thickness direction thereof. Each first opening K1 is provided with the first auxiliary electrode 41 and the second auxiliary electrode 42 therein. In this embodiment, the area of the first common electrode can be further increased, thereby greatly reducing the resistance of the first power supply structure, which in turn significantly reduces the voltage drop of signal transmission over the first power supply structure and power consumption loss of the first power supply structure while improving uneven display.

Figure 9:
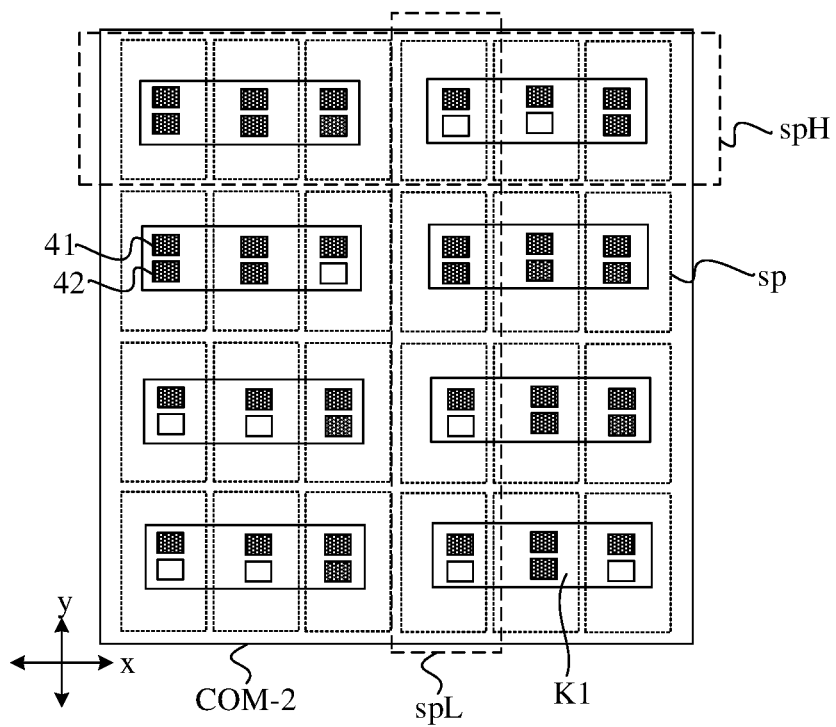
FIG. 9 is another schematic partial top view of the display panel shown in FIG. 3.

FIG. 8 illustrates that each first opening corresponds to a respective one of the plurality of subpixels. In an embodiment of the present disclosure, each first opening may correspond to n subpixels, where n is greater than or equal to 2. Further, each first opening may be provided with n first auxiliary electrodes therein. Specifically, FIG. 9 is another schematic partial top view of the display panel shown in FIG. 3. As shown in FIG. 9, the first common electrode is the block electrode COM-2 corresponding to the plurality of subpixel rows spH and the plurality of subpixel columns spL. The block electrode COM-2 has a plurality of first openings K1. Each first opening K1 corresponds to three subpixels sp and is provided with three first auxiliary electrodes 41 therein.

When each first opening K1 corresponds to a respective one of the plurality of subpixels sp, the first opening K1 is provided with the first auxiliary electrode 41 therein as shown in FIG. 8. In this case, two gaps are formed between sides of the first auxiliary electrode 41 and respective sides of the first opening K1 in the first direction x, i.e., the left-and-right direction as shown in FIG. 8. Further, for three first auxiliary electrodes 41 arranged in succession, six gaps are correspondingly formed between the sides of the first auxiliary electrode 41 and the respective sides of the first opening K1 in the left-and-right direction of FIG. 8. When each first opening K1 corresponds to three subpixels sp, gaps are formed between the sides of the first auxiliary electrode 41 and the respective sides of the first opening K1 and between two adjacent auxiliary electrodes 41 in the left-and-right direction of FIG. 9. Further, for the three first auxiliary electrodes 41 arranged in succession, four gaps are correspondingly formed in the left-and-right direction of FIG. 9. If each of the gaps has a constant width in the first direction x, in the illustrated embodiment as shown in FIG. 9, a space occupied by the openings can be advantageously reduced, thereby increasing the area of the first common electrode. That is, in the embodiment where each first opening corresponds to two or more subpixels, the auxiliary electrodes disposed within the first opening can be insulated from each other and intensively arranged, such that the space occupied by the first openings can be reduced.

The embodiments as described above and shown in FIGS. 6 to 9 are illustrative in which the first power supply structure includes the common electrode, and the shape of the common electrode and the corresponding relationship between the common electrode and the subpixels are described. The arrangement of the common electrode as described above and shown in FIGS. 6 to 9 may also be applied to an embodiment in which the second power supply structure includes the common electrodes, as described hereinafter.

Further, with reference to FIG. 8 again, a distance between the side of the first opening K1 and the side of the auxiliary electrode (the first auxiliary electrode 41 as schematically shown in FIG. 8) is defined as D1, where $0.1\ \mu m \leqslant D1 \leqslant 5\ \mu m$. FIG. 8 shows the distance D1 extending in the first direction x. In the illustrated embodiment shown in FIG. 8, the first opening is provided with the first auxiliary electrode and the second auxiliary electrode therein. In some embodiments, the first opening is merely provided with the first auxiliary electrode therein. The first opening is configured in a manner that the side of the first opening is spaced apart from the side of the respective auxiliary electrode at a predetermined distance, such that the common electrode is insulated from the auxiliary electrode while avoiding the first opening from being formed too large so as to affect the area of the common electrode.

In a display panel of the related art, power supply lines and data lines of a power supply structure are arranged in the same film layer and extend in the same direction, and the power supply lines and scan lines intersect each other to define a region where the subpixels are located. Accordingly, the power supply line has a narrower line width. However, in the present disclosure, as shown in FIGS. 3 and 4, the first power supply structure 21 is arranged in the different film layer from the first electrode d and the second electrode s of the transistor. That is, the first power supply structure 21 is located in the different film layer from the source electrode and the drain electrode of the transistor. Thus, the data lines, the source electrode or the drain electrode do not have to be avoided during manufacture of the first power supply structure. The first power supply structure may include a strip electrode or a block electrode with a larger width so as to increase the area of the common electrode of the first power supply structure. In some embodiments, the first common electrode of the first power supply structure may have a plurality of first openings, and the auxiliary electrodes are disposed within the first openings to connect the pixel circuit and the electrodes of the light-emitting diodes. In some embodiments of the present disclosure, the area of each of the first openings is significantly less than that of the subpixel region defined by the intersection of the power supply line and the scan line in the related art.

Figure 10:
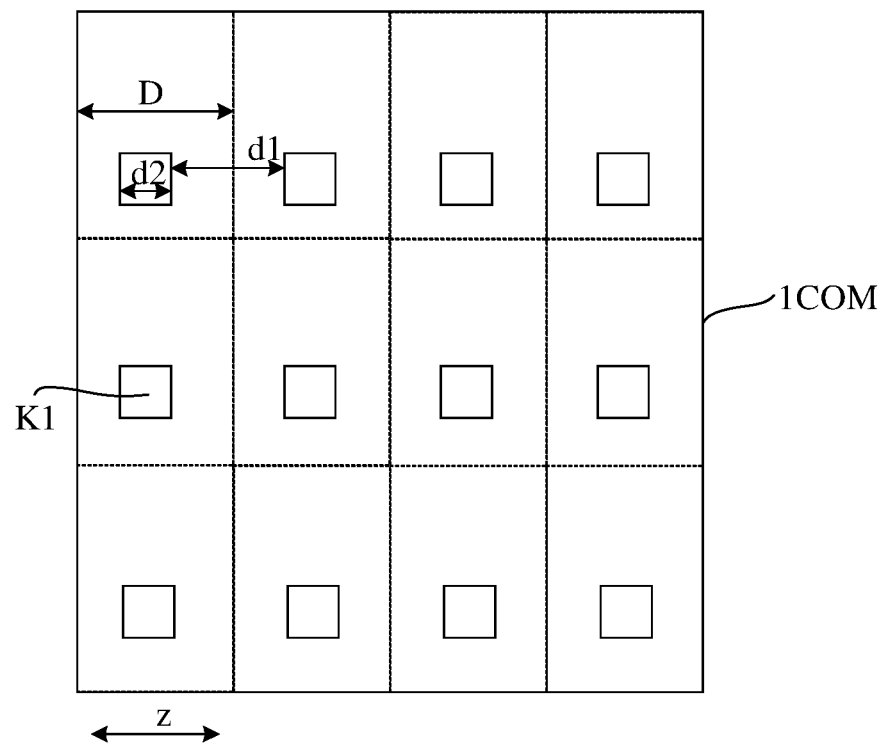
FIG. 10 is a schematic top view of another display panel according to an embodiment of the present disclosure.

FIG. 10 shows a schematic top view of another display panel according to an embodiment of the present disclosure and only illustrates a structure of a first common electrode. As shown in FIG. 10, the first common electrode 1COM has at least two first openings K1 arranged in a third direction z. A portion of the first common electrode 1COM between two adjacent first openings K1 has a length d1 in the third direction z, and each first opening K1 has a length d2 in the third direction z, where $R=d1:d2$ and $R \geqslant 3/7$. FIG. 10 illustrates that each first opening K1 corresponds to a subpixel (not shown). The subpixel has a length D in the third direction z, and the length d2 of the first opening K1 in the third direction z satisfies the following relationship: d2 ≤ 70% D. The third direction z is the same as a direction along which the subpixel rows extend, or the third direction z is the same as a direction along which the subpixel columns extend. In some embodiments of the present disclosure, a ratio of the length of the portion of the first common electrode between the two adjacent first openings in the third direction to the length of the first opening in the third direction is significantly greater than that of the line width of the power supply line to a width of the subpixel region between adjacent power supply lines in the related art. In this way, a projection area of a portion of the first power supply structure in the display region on the plane of the display panel is not less than 50% of the area of the display region. Compared with the related art, the resistance of the first power supply structure can be significantly reduced, thereby reducing power consumption losses and improving uneven display.

FIG. 10 illustrates that only one first opening corresponds to one subpixel. Further, in an embodiment in which one first opening corresponds to two or three subpixels, the ratio of the length of the portion of the first common electrode between the two adjacent first openings in the third direction to the length of the first opening in the third direction is also greater than 3/7.

Figure 11:
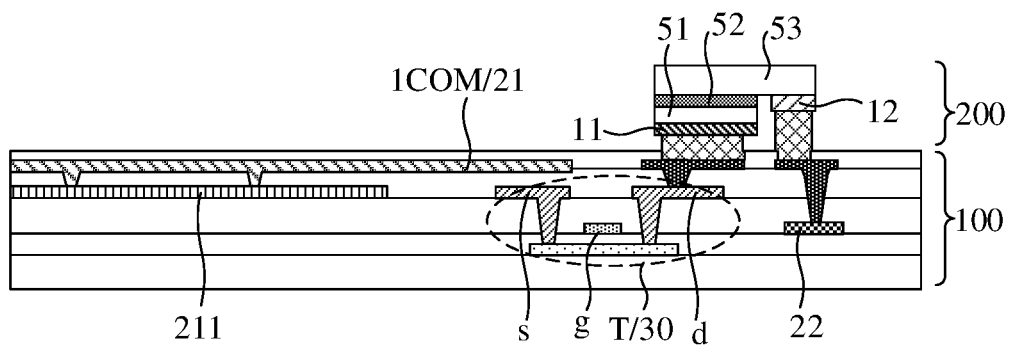
FIG. 11 is a schematic sectional view of another display panel according to an embodiment of the present disclosure.

FIG. 11 shows a schematic sectional view of another display panel according to an embodiment of the present disclosure. As shown in FIG. 11, the first power supply structure 21 further includes a first power supply line 211 electrically connected to the first common electrode 1COM. The first power supply line 211 and the first electrode s of the transistor T are arranged in the same layer. The first power supply line and the first common electrode are connected in parallel, such that the resistance of the first power supply structure can be further reduced, thereby further reducing the voltage drop across the first power supply structure. Specifically, in a direction perpendicular to the plane where the display panel is located, the first common electrode 1COM overlaps with the first power supply line 211 connected thereto, and the first power supply line 211 and the data lines of the display panel extend in the same direction. FIG. 11 only schematically shows that the second power supply structure 22 and the control electrode g of the transistor T are arranged in the same layer, and the present disclosure is not intended to be limited thereto.

Figure 12:
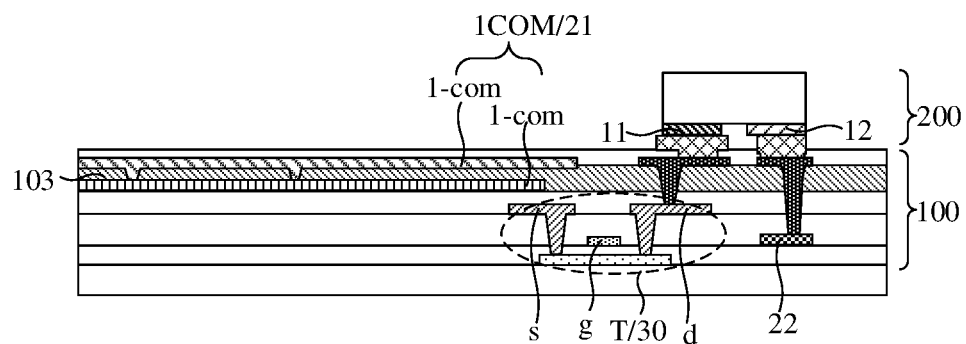
FIG. 12 is a schematic sectional view of another display panel according to an embodiment of the present disclosure.

In another embodiment, the first common electrode includes at least two laminated first sub-common electrodes. FIG. 12 shows a schematic sectional view of another display panel according to an embodiment of the present disclosure. As shown in FIG. 12, the first common electrode 1COM includes two laminated first sub-common electrodes 1COM electrically connected to each other, and an insulation layer 103 is interposed between the two laminated first sub-common electrodes. In this embodiment, the resistance of the first power supply structure can be further reduced, thereby further reducing the voltage drop across the first power supply structure. FIG. 12 merely illustrates that the second power supply structure 22 is located in the same layer as the control electrode g of the transistor T, and the present disclosure is not intended to be limited thereto.

Figure 13:
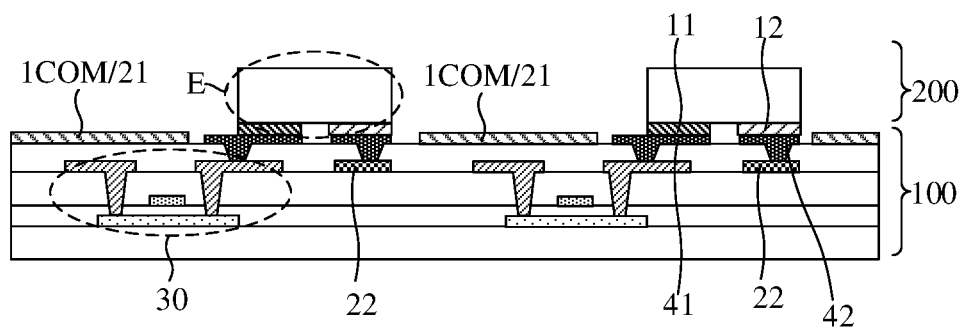
FIG. 13 is a schematic sectional view of another display panel according to an embodiment of the present disclosure.

FIG. 13 shows a schematic sectional view of another display panel according to an embodiment of the present disclosure. As shown in FIG. 13, the first power supply structure includes the first common electrode 1COM arranged at the side of the pixel circuit 30 close to the pixel array 200. The array substrate 100 further includes the first auxiliary electrode 41 and the second auxiliary electrode 42, which are both arranged in the same layer as the first common electrode 1COM. The pixel circuit 30 is connected to the first electrode 11 of the light-emitting diode E by the first auxiliary electrode 41, and the second power supply structure 22 is connected to the second electrode 12 of the light-emitting diode E by the second auxiliary electrode 42. Further, the first auxiliary electrode 41 is reused as a first binding electrode, and the first electrode 11 of the light-emitting diode E is bound to the first auxiliary electrode 41. The second auxiliary electrode 42 is reused as a second binding electrode, and the second electrode 12 of the light-emitting diode E is bound to the second auxiliary electrode 42.

Specifically, the first common electrode is made of materials including two or more of gold, aluminum, copper, tin, silver and indium. The array substrate and a light-emitting diode array are separately formed during manufacture of the display panel, where the array substrate includes the first common electrode, the first auxiliary electrode and the second auxiliary electrode that are arranged in the same layer and made of the same material. Further, the first common electrode, the first auxiliary electrode and the second auxiliary electrode are disposed at the outermost side of the array substrate. The light-emitting diode array is then transferred onto the array substrate, such that the first electrode of the light-emitting diode is aligned with the first auxiliary electrode and the second electrode of the light-emitting diode is aligned with the second auxiliary electrode. Thereafter, the auxiliary electrodes are melted and then solidified to form a eutectic layer through a hot pressing process, and finally, the first auxiliary electrode is bound to the first electrode and the second auxiliary electrode is bound to the second electrode.

In some embodiments, the array substrate further includes an electrode connection layer disposed between the first power supply structure and the light-emitting diode. The electrode connection layer includes a first connection electrode and a second connection electrode. Further, the first auxiliary electrode is electrically connected to the first electrode of the light-emitting diode by the first connection electrode, and the second auxiliary electrode is electrically connected to the second electrode of the light-emitting diode by the second connection electrode. The array substrate and the light-emitting diode are separately formed during manufacture of the display panel. Thereafter, the light-emitting diode array is transferred onto the array substrate and then bound thereto. A binding layer for binding usually has a relatively large thickness.

Figure 14:
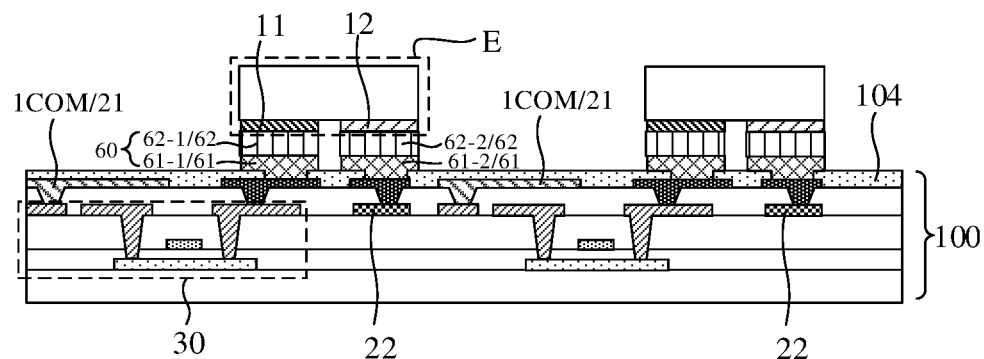
FIG. 14 is a schematic sectional view of another display panel according to an embodiment of the present disclosure.

Specifically, in an embodiment, the electrode connection layer includes a metal connection layer and a binding layer deposited on the metal connection layer. The metal connection layer is configured to be connected to the auxiliary electrodes through via holes of the insulation layer, and the binding layer is configured to bind the light-emitting diodes and the array substrate. Further, the binding layer is made of materials including two or more of gold, aluminum, copper, tin, silver and indium. FIG. 14 shows a schematic sectional view of another display panel according to an embodiment of the present disclosure. As shown in FIG. 14, the electrode connection layer 60 includes a metal connection layer 61 and a binding layer 62. A first insulation layer 104 is arranged on the first common electrode 1COM, and the metal connection layer 61 is arranged on the first insulation layer 104. The metal connection layer 61 includes a first connection portion 61-1 electrically connected to the first auxiliary electrode 41 by a via hole (not shown) of the first insulation layer 104, and a second connection portion 61-2 electrically connected to the second auxiliary electrode 42 by a via hole (not shown) of the first insulation layer 104. The binding layer 62 includes a first binding electrode 62-1 deposited on the first connection portion 61-1, and a second binding electrode 62-2 deposited on the second connection portion 61-2. The first electrode 11 of the light-emitting diode E is bound to the first binding electrode 62-1, and the second electrode 12 of the light-emitting diode E is bound to the second binding electrode 62-2. In this embodiment, the connection portions of the metal connection layer are connected to the respective auxiliary electrodes by the via holes of the first insulation layer, and the binding electrodes for binding are then deposited on the respective connection portions to accommodate a deposition process of the binding electrodes. Accordingly, a reliable connection between the binding electrodes and the respective auxiliary electrodes is obtained.

In an alternative embodiment, the electrode connection layer may merely include the metal connection layer. When manufacturing the array substrate, the first insulation layer is formed after forming the first common electrode, the first auxiliary electrode and the second auxiliary electrode. The first insulation layer is then patterned to form the via holes. Thereafter, the electrode connection layer is formed on the first insulation layer, and the electrode connection layer includes the first connection electrode connected to the first auxiliary electrode through the via hole, and the second connection electrode is connected to the second auxiliary electrode through the via hole. The binding layer is then deposited on the electrode connection layer, and includes the first binding electrode deposited on the first connection electrode and the second binding electrode deposited on the second connection electrode. The binding electrodes are configured to realize the binding between the light-emitting diodes and the array substrate. The structure of the display panel in this embodiment shall be understood with reference to FIG. 14.

Figure 15:
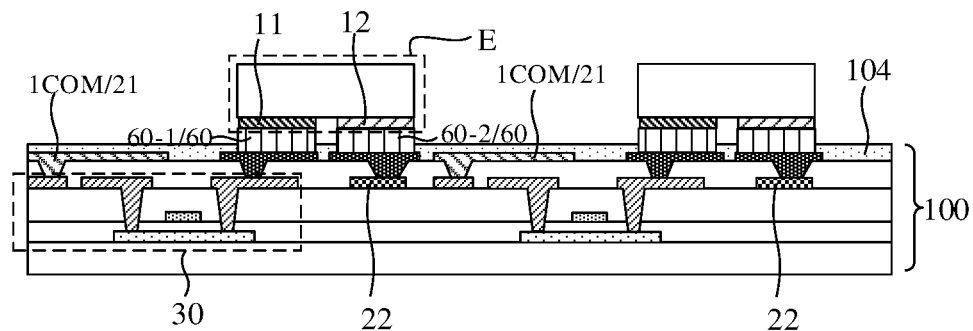
FIG. 15 is a schematic sectional view of another display panel according to an embodiment of the present disclosure.

In another embodiment, the electrode connection layer is reused as the binding layer. FIG. 15 shows a schematic sectional view of another display panel according to an embodiment of the present disclosure. As shown in FIG. 15, the electrode connection layer 60 includes a first connection electrode 60-1 bound to the first electrode 11 of the light-emitting diode E and a second connection electrode 60-2 bound to the second electrode 12 of the light-emitting diode E. When manufacturing the array substrate 100, the first insulation layer 104 is formed after forming the first common electrode 1COM, the first auxiliary electrode 41 and the second auxiliary electrode 42. Thereafter, the first insulation layer 104 is etched to form notches (not shown, wherein an area of each notch is greater than that of a via hole of the conventional insulation layer, such that the area of the notch is large enough to ensure that the electrode connection layer with a larger thickness can be deposited within the notches) for exposing the first auxiliary electrode 41 and the second auxiliary electrode 42, respectively. The electrode connection layer 60 is then deposited within the notches, such that a first portion of the electrode connection layer deposited in the notch for exposing the first auxiliary electrode 41 is formed as the first connection electrode 60-1, and a second portion of the electrode connection layer deposited in the notch for exposing the second auxiliary electrode 42 is formed as the second connection electrode 60-2. The light-emitting diode array is transferred onto the array substrate and an alignment operation is performed, such that the first electrode of the light-emitting diode is aligned with the first connection electrode, and the second electrode of the light-emitting diode is aligned with the second connection electrode. Thereafter, the connection electrodes are melted and then solidified to form an eutectic layer through the hot pressing process, so that the first electrode is bound to the first connection electrode, and the second electrode is bound to the second connection electrode. In this embodiment, the metal connection layer is eliminated, thereby saving materials while simplifying the process.

FIGS. 14 and 15 illustrate two embodiments for binding the light-emitting diodes and the array substrate. In the embodiment shown in FIG. 14, the connection metal layer and the binding layer are formed, and the binding layer is configured to bind the light-emitting diode. Further, the binding layer having the relatively large thickness is deposited on the connection metal layer. The connection metal layer is connected to circuit elements below the insulation layer through the via holes of the insulation layer to ensure the reliable connection between the binding layer and the circuit elements underneath. In addition, in the embodiment shown in FIG. 15, the insulation layer above the circuit elements is formed with the notches for exposing the circuit elements, and the electrode connection layer is deposited within the notches to achieve an electrical connection between the electrode connection layer and the circuit elements underneath while the electrode connection layer is reused as the binding layer. These two embodiments described with reference to FIGS. 14 and 15 are also applicable to the following embodiments of the present disclosure to achieve the binding of the light-emitting diodes and the array substrate.

Figure 16:
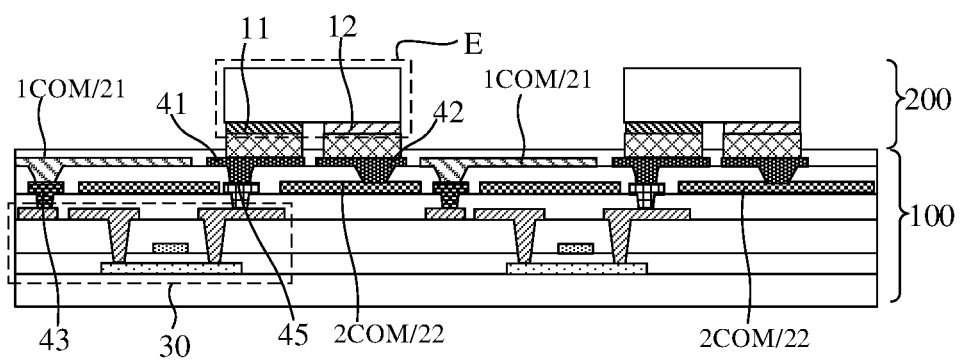
FIG. 16 is a schematic sectional view of another display panel according to an embodiment of the present disclosure.

In an embodiment, the first power supply structure includes the first common electrode, and the second power supply structure includes a second common electrode. FIG. 16 shows a schematic sectional view of another display panel according to an embodiment of the present disclosure. As shown in FIG. 16, the first power supply structure 21 includes the first common electrode 1COM arranged at the side of the pixel circuit 30 close to the pixel array 200. The second power supply structure 22 includes a second common electrode 2COM disposed between the first common electrode 1COM and the pixel circuit 30. The array substrate 100 further includes the first auxiliary electrode 41 and the second auxiliary electrode 42. The first auxiliary electrode 41 and the first common electrode 1COM are arranged in the same layer and insulated from each other, and the second auxiliary electrode 42 and the first common electrode 1COM are arranged in the same layer and insulated from each other. The first electrode (not shown) of the transistor of the pixel circuit 30 is electrically connected to the first electrode 11 of the light-emitting diode E by the first auxiliary electrode 41, and the second common electrode 2COM is electrically connected to the second electrode 12 of the light-emitting diode E by the second auxiliary electrode 42. In this embodiment, each of the first power supply structure and the second power supply structure includes a common electrode. Therefore, the resistance of each of the first power supply structure and the second power supply structure can be reduced, which reduces the voltage drop across each of the first power supply structure and the second power supply structure, thereby significantly reducing power consumption loss while improving uneven display.

With continued reference to FIG. 16, the array substrate 100 further includes a plurality of third auxiliary electrodes 43 arranged in the same layer as the second common electrode 2COM. The first common electrode 1COM is electrically connected to the pixel circuit 30 by the respective third auxiliary electrode 43. Specifically, the pixel circuit 30 includes a plurality of transistors (only one is shown). The first common electrode 1COM is electrically connected to a source electrode or a drain electrode of one of the plurality of transistors (the specific structure thereof is not shown) of the pixel circuit 30 via the third auxiliary electrode 43, so that the first common electrode 1COM is connected to the first electrode 11 of the light-emitting diode E by the pixel circuit 30. In this embodiment, the second common electrode 2COM is disposed between the first common electrode 1COM and the pixel circuit 30. A reliable connection between the first common electrode 1COM and the source electrode or the drain electrode of the transistor of the pixel circuit can be achieved by providing the third auxiliary electrode 43. It is thus unnecessary to form a deeper and larger through hole in an insulation layer between a film layer where the first common electrode 1COM is located and a film layer where the source and drain electrodes of the transistor of the pixel circuit are located. Moreover, the third auxiliary electrode 43 and the second common electrode 2COM may be formed in the same process without additional processes.

In addition, as shown in FIG. 16, the array substrate further includes a plurality of fifth auxiliary electrodes 45 arranged in the same layer as the second common electrode 2COM. The first auxiliary electrode 41 is electrically connected to the pixel circuit 30 by the respective fifth auxiliary electrode 45. The fifth auxiliary electrodes 45 and the second common electrode 2COM are formed in the same process.

FIGS. 11 to 16 illustrate that the second power supply structure is arranged at the side of the first power supply structure away from the light-emitting diode. In other embodiments, the second power supply structure may be disposed between the first power supply structure and the light-emitting diode, i.e., between the first common electrode and the light-emitting diode. That is, the second power supply structure is arranged at the side of the first common electrode away from the pixel circuit, such that the second power supply structure is arranged in a different layer from all the circuit elements of the pixel circuit, which can increase a design degree of freedom of the second power supply structure. The second power supply structure may be configured to be provided with the common electrode to reduce the resistance of the second power structure, thereby reducing the voltage drop across the second power supply structure to further reduce power consumption loss of the display panel while improving uneven display.

Figure 17:
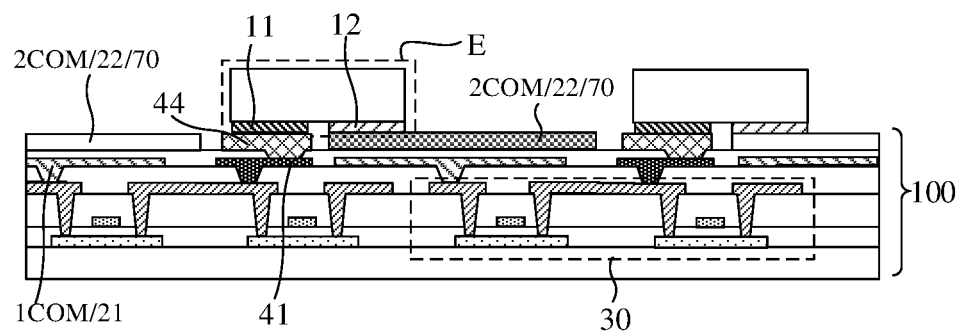
FIG. 17 is a schematic sectional view of another display panel according to an embodiment of the present disclosure.

Specifically, FIG. 17 shows a schematic sectional view of another display panel according to an embodiment of the present disclosure. As shown in FIG. 17, the first power supply structure 21 includes the first common electrode 1COM. The first auxiliary electrode 41 is arranged in the same layer as the first common electrode 1COM and electrically connected to the first electrode 11 of the light-emitting diode E by the pixel circuit 30. The second power supply structure 22 includes the second common electrode 2COM disposed between the first common electrode 1COM and the light-emitting diode E. The second power supply structure 22 is electrically connected to the second electrode 12 of the light-emitting diode E. In this embodiment, the second power supply structure is configured to be provided with the common electrode, such that the resistance of the second power supply structure can be reduced, thereby reducing the voltage drop across the second power supply structure to further reduce power consumption loss of the display panel while further improving uneven display. In this embodiment, the second common electrode may be a strip electrode or a block electrode. The arrangement of the second common electrode shall be understood with reference to the embodiments shown in FIGS. 6 to 9 as described above.

With reference to FIG. 17 again, the array substrate 100 further includes a plurality of fourth auxiliary electrodes 44 arranged in the same layer as the second common electrode 2COM. The first auxiliary electrode 41 is electrically connected to the first electrode 11 of the light-emitting diode E by the respective fourth auxiliary electrode 44. Further, the fourth auxiliary electrodes 44 and the second common electrode 2COM are formed in the same process.

Figure 18A:
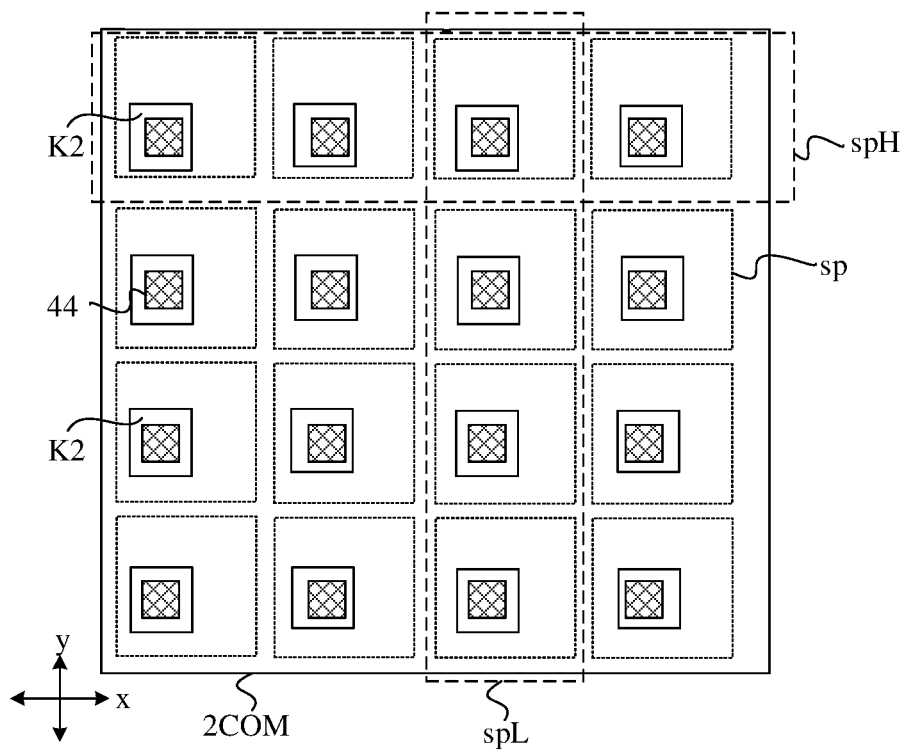
FIG. 18A is a schematic partial top view of the display panel shown in FIG. 17.

FIG. 18A shows a schematic partial top view of the display panel as shown in FIG. 17, and merely illustrates a structure of a film layer where the subpixels and the second power supply structure are located. As shown in FIG. 18A, the subpixel rows spH extend in the first direction x and the subpixel columns spL extend in the second direction y. The second common electrode 2COM is formed with a plurality of second openings K2 penetrating through the second common electrode 2COM in a thickness direction thereof. The fourth auxiliary electrode 44 is disposed within the second opening K2. FIG. 18A illustrates that one subpixel sp corresponds to one second opening K2, in which only one fourth auxiliary electrode 44 is disposed. The fourth auxiliary electrode 44 is configured to electrically connect the pixel circuit and the first electrode of the light-emitting diode. An area of the second opening K2 may be configured to be small enough to maximize an area of the second common electrode in the display region in a case that the fourth auxiliary electrodes 44 and the second common electrode 2COM are insulated from each other.

In an alternative embodiment, one second opening may correspond to two subpixels and may be provided with two fourth auxiliary electrodes therein. In another embodiment, one second opening may correspond to three subpixels and may be provided with three fourth auxiliary electrodes therein, and the illustration thereof is omitted herein.

Figure 18B:
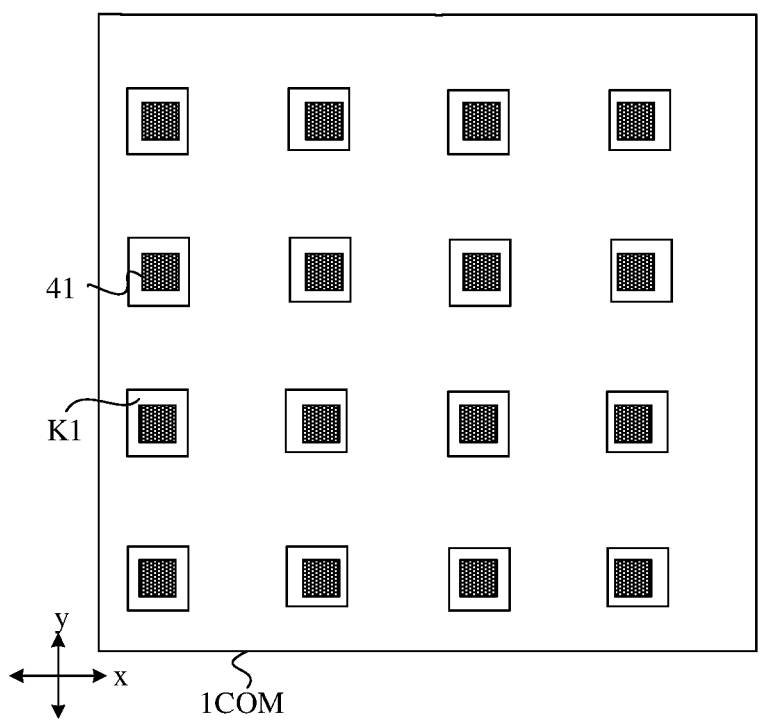
FIG. 18B is another schematic partial top view of the display panel shown in FIG. 17.

Specifically, FIG. 18B shows another schematic partial top view of the display panel shown in FIG. 17. A schematic top view of the first power supply structure is merely shown in FIG. 18B. The first power supply structure includes the first common electrode 1COM having the plurality of first opening K1. Each first opening is provided with the first auxiliary electrode 41 therein. The first auxiliary electrode 41 is configured to electrically connect the pixel circuit 30 and the first electrode 11 of the light-emitting diode E. In this embodiment, the first power supply structure is disposed between the pixel circuit 30 and the light-emitting diode E, and the first common electrode 1COM is only formed with the first openings K1. Therefore, an area of the first opening K1 can be configured to be small enough to increase an area of the first common electrode 1COM in the display region in a case that the first common electrode 1COM and the first auxiliary electrodes 41 are insulated from each other.

Specifically, referring to FIG. 17 again, the array substrate 100 further includes a binding layer 70. The second power supply structure 22 is arranged in the binding layer 70 so as to be bound to the second electrode 12 of the light-emitting diode E. Correspondingly, the fourth auxiliary electrode 44 is bound to the first electrode 11 of the light-emitting diode E. The material and the binding process of the binding layer 70 can be referred to the embodiments as described above, and the details thereof will be omitted herein. The second power supply structure is arranged in the binding layer, such that the second power supply structure is provided with the common electrode, thereby reducing the resistance of the second power supply structure without increasing a film thickness of the display panel.

Figure 19:
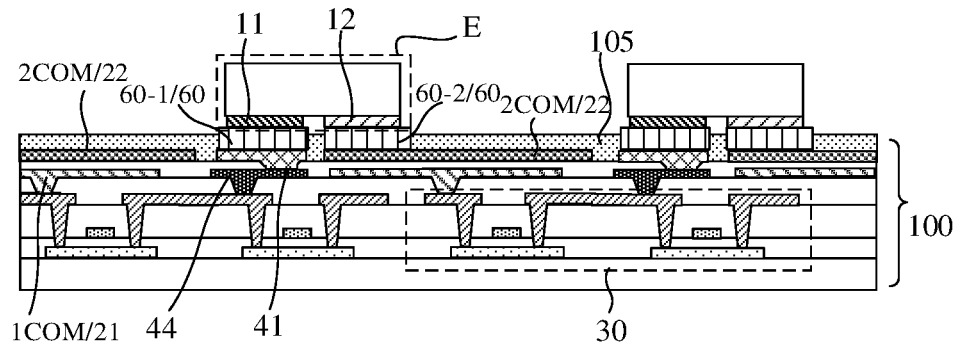
FIG. 19 is a schematic sectional view of another display panel according to an embodiment of the present disclosure.

FIG. 19 shows a schematic sectional view of another display panel according to an embodiment of the present disclosure. As shown in FIG. 19, the array substrate 100 further includes the electrode connection layer 60 and a second insulation layer 105 disposed between the second power supply structure 22 and the electrode connection layer 60. The electrode connection layer 60 is arranged at the side of the second power supply structure 22 away from the first common electrode 1COM. Further, the electrode connection layer 60 includes the first connection electrode 60-1 and the second connection electrode 60-2. The first auxiliary electrode 41 is electrically connected to the first connection electrode 11 of the light-emitting diode E by the first connection electrode 60-1, and the second power supply structure 22 is electrically connected to the second electrode 12 of the light-emitting diode E by the second connection electrode 60-2. Alternatively, the electrode connection layer may include the metal connection layer and the binding layer, i.e., has the same structure as that of the electrode connection layer as shown in FIG. 14. Alternatively, the electrode connection layer is the binding layer, i.e., has the same structure as that of the electrode connection layer as shown in FIG. 15.

Figure 20:
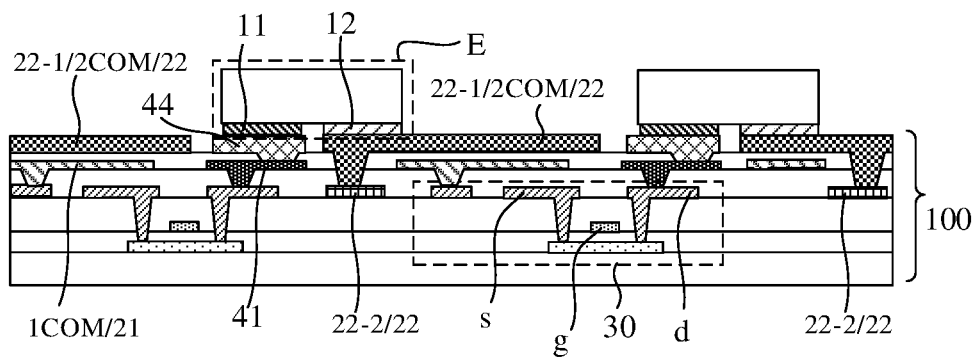
FIG. 20 is a schematic sectional view of another display panel according to an embodiment of the present disclosure.

FIG. 20 shows a schematic sectional view of another display panel according to an embodiment of the disclosure. As shown in FIG. 20, the second power supply structure 22 includes a second upper power supply electrode 22-1 and a second lower power supply electrode 22-2 electrically connected with each other. The second upper power supply electrode 22-1 is disposed between the first common electrode 1COM and the light-emitting diode E. The second lower power supply electrode 22-2 includes a plurality of second power supply lines located in the same layer as the first electrode d of the transistor T. Specifically, the data lines of the display panel are located in the same layer as the first electrode d. The second power supply lines are configured such that the second power supply lines and the data lines extend in the same direction to ensure that the second power supply lines are insulated from the data lines and the second power supply lines are insulated from the first electrode and the second electrode. In this embodiment, the second upper power supply electrode and the second lower power supply electrode are connected to each other, such that the resistance of the second power supply structure is further reduced. Moreover, the second power supply lines of the second lower power supply electrode are located in the same layer as the first electrode of the transistor. Therefore, it is unnecessary for the display panel to be provided with additional film layer structure.

In some alternative embodiments, one subpixel may include at least two light-emitting diodes, which are connected to the same first auxiliary electrode. That is, the light-emitting diodes of the one subpixel are connected to the same pixel circuit, which can reduce influence of poor binding of the light-emitting diodes to the array substrate on the display of the subpixels. In the one subpixel, some of the light-emitting diodes are poorly bound, and the remaining well-bound light-emitting diodes can still allow the subpixels to be displayed.

Figure 21:
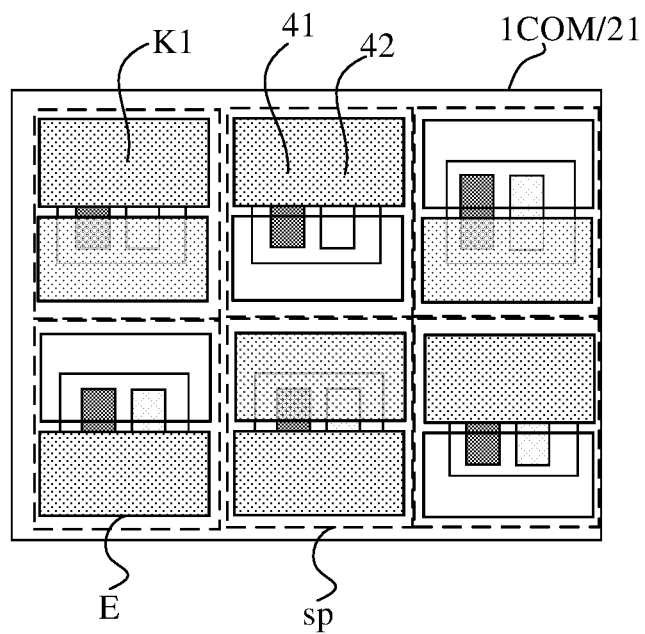
FIG. 21 is a schematic top view of another display panel according to an embodiment of the present disclosure.

FIGS. 3, 11 to 16 each illustrates that the first power supply structure is arranged at the side of the second power supply structure close to the pixel array. In this case, when the first power supply structure includes the common electrode, the first auxiliary electrode and the second auxiliary electrode are arranged in the same layer as the common electrode. Further, the first power supply structure is connected to the pixel circuit that is connected to the first electrode of the light-emitting diode by the first auxiliary electrode, and the second power supply structure is connected to the second electrode of the light-emitting diode by the second auxiliary electrode. Specifically, FIG. 21 shows a schematic top view of another display panel according to an embodiment of the present disclosure. As shown in FIG. 21, only the first power supply structure 21 and the light-emitting diodes E of the subpixels are simply illustrated. For example, one subpixel sp includes two light-emitting diodes E. As shown in FIG. 21, the first power supply structure 21 includes the first common electrode 1COM having the plurality of first openings K1, each of which is provided with the first auxiliary electrode 41 and the second auxiliary electrode 42 therein. The first electrodes (not shown) of the two light-emitting diodes E are connected to the same first auxiliary electrode 41, and the second electrodes (not shown) of the two light-emitting diodes E are connected to the same second auxiliary electrode 42. Each of embodiments, in which the first common electrode is a stripe electrode and one first opening corresponds to two or three subpixels, shall be understood by reference herein, and the details thereof will be omitted herein.

Figure 22:
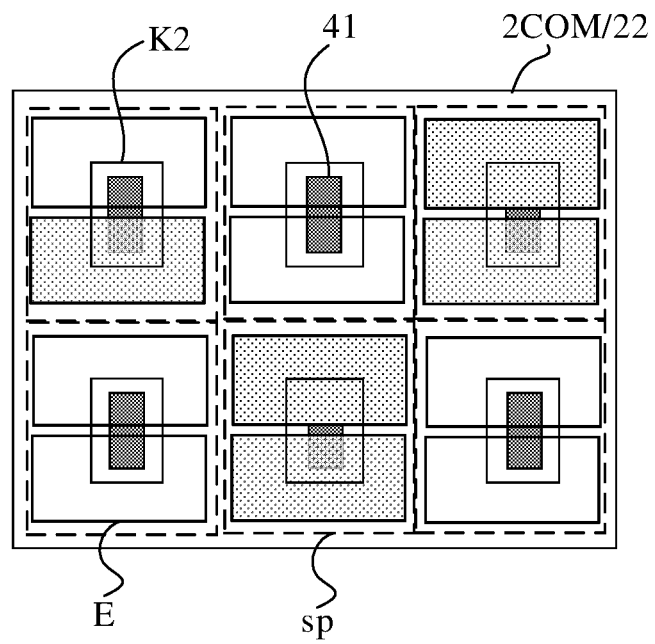
FIG. 22 is a schematic top view of another display panel according to an embodiment of the present disclosure.

In the above embodiments as shown in FIGS. 19 and 20, the second power supply structure is arranged at the side of the first power supply structure close to the pixel array. In this case, when the second power supply structure includes the common electrode, the common electrode is generally provided with the first auxiliary electrode to ensure that the pixel circuit below the second power supply structure can be electrically connected to the first electrode of the light-emitting diode by the first auxiliary electrode. Specifically, FIG. 22 shows a schematic top view of another display panel according to an embodiment of the present disclosure. As shown in FIG. 22, only the second power supply structure 22 and the light-emitting diodes E of the subpixels are simply illustrated. For example, one subpixel sp includes two light-emitting diodes E. As illustrated in FIG. 22, the second power supply structure 22 includes the second common electrode 2COM having the plurality of second openings K2, each of which is provided with the first auxiliary electrode 41 therein. The first electrodes (not shown) of the two light-emitting diodes E are connected to the same first auxiliary electrode 41, and the second electrodes (not shown) of the two light-emitting diodes E are electrically connected to the second common electrode 2COM. Each of embodiments, in which the second common electrode is a strip electrode and one second opening corresponds to two or three subpixels, shall be understood by reference herein, and the details thereof will be omitted herein.

Figure 23:
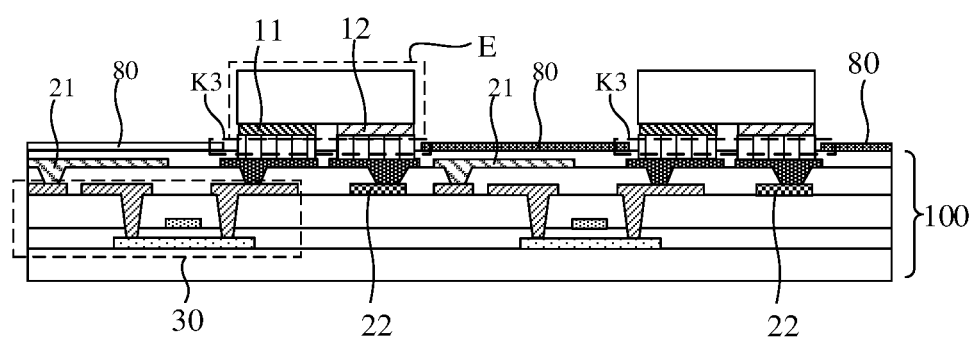
FIG. 23 is a schematic sectional view of another display panel according to an embodiment of the present disclosure.

Further, FIG. 23 shows a schematic sectional view of another display panel according to an embodiment of the present disclosure. As shown in FIG. 23, the display panel further includes a light shielding layer 80 arranged at a side of the first power supply structure 21 and the second power supply structure 22 close to the light-emitting diode E. The light shielding layer 80 is overlapped with the first power supply structure 21 or the second power supply structure 22 in a direction perpendicular to a plane where the array substrate 100 is located. The light shielding layer 80 includes a plurality of third openings K3 overlapped with the light-emitting diodes E in the direction perpendicular to the plane where the array substrate 100 is located. FIG. 23 illustrates that the first power supply structure 21 is arranged at the side of the second power supply structure 22 away from the pixel circuit 30. In an embodiment in which the first power supply structure 21 includes the first common electrode and/or the second power supply structure 22 includes the second common electrode, the common electrode of a large area may reflect ambient light, which in turn affects an effect of the display panel. In some embodiments of the present disclosure, the light shielding layer is provided to shield the common electrode of the large area, thereby preventing the ambient light from being reflected by the common electrode to ensure the display effect of the display panel.

Figure 24:
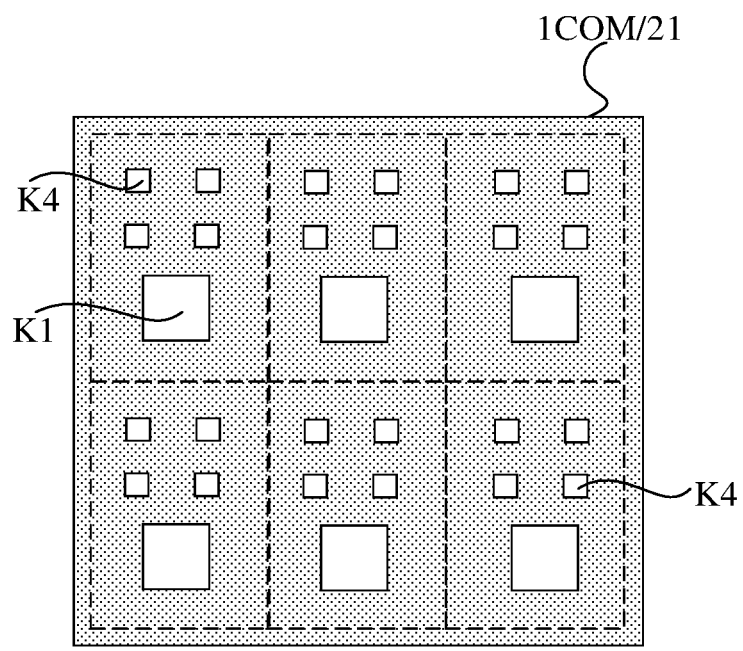
FIG. 24 is a schematic top view of a first power supply structure of another display panel according to an embodiment of the present disclosure.

Further, in an embodiment, the common electrode includes a fourth opening, into which an insulation layer directly in contact with the common electrode is filled. The common electrode is usually made of a metal material, and upper and lower insulation layers adjacent to the common electrode are usually made of inorganic materials. In this embodiment, the common electrode is formed with the fourth opening, such that an adhesive force between the common electrode of the large area and its adjacent upper and lower insulation layers can be increased, thereby avoiding film peeling from being occurred in the common electrode of the large area. FIG. 24 shows a schematic top view of the first power supply structure of the display panel according to an embodiment of the present disclosure. As shown in FIG. 24, the first power supply structure 21 includes the first common electrode 1COM including the plurality of first openings K1 and a plurality of fourth openings K4. In some embodiments, the first auxiliary electrode is disposed in the first opening K1. In some embodiments, the first auxiliary electrode and the second auxiliary electrode are disposed in the first opening K1. The fourth opening K4 is configured to achieve reliable binding between the first common electrode 1COM and the upper and lower insulation layers. The fourth opening K4 has an area that is less than the area of the first opening K1. In order to achieve the reliable binding between the common electrode and the upper and lower insulation layers at different positions, a plurality of fourth openings may be formed in the common electrode at a position corresponding to one subpixel, and the fourth openings are arranged in a higher density than that of the first openings. FIG. 24 merely illustrates that the first common electrode includes the first openings. In an embodiment where the first common electrode is a strip electrode, the fourth openings may also be formed in the strip electrode, which will not be illustrated herein. In addition, in an embodiment where the second power supply structure includes the common electrode, the arrangement of the fourth openings of common electrode may be understood by reference herein, and the details thereof are omitted herein.

In some embodiments of the present disclosure, the second common electrode overlaps with the first common electrode in the direction perpendicular to the plane where the array substrate is located. In the display region, an area of an overlapping portion of the second common electrode and the first common electrode is defined as $S_2$, and an area of an orthographic projection of a portion of the second common electrode in the display region on the plane of display panel is defined as $S_3$, where $S_2 \geq 50\% \, S_3$. In this embodiment, an area of an orthographic projection of a portion of the first common electrode in the display region on the display panel is not less than 50% of the area of the display region, and an area of an orthographic projection of a portion of the second common electrode in the display region on the display panel is not less than 50% of the area of the display region. Further, the area of the overlapping portion of the first common electrode and the second common electrode is relatively large. In accordance with one or more embodiments of the present disclosure, the resistance of the first power supply structure and the second power supply structure can be significantly reduced, thereby reducing the voltage drop of the signal transmission over the power supply structures and power consumption loss of the power supply structures while improving uneven display.

Figure 25:
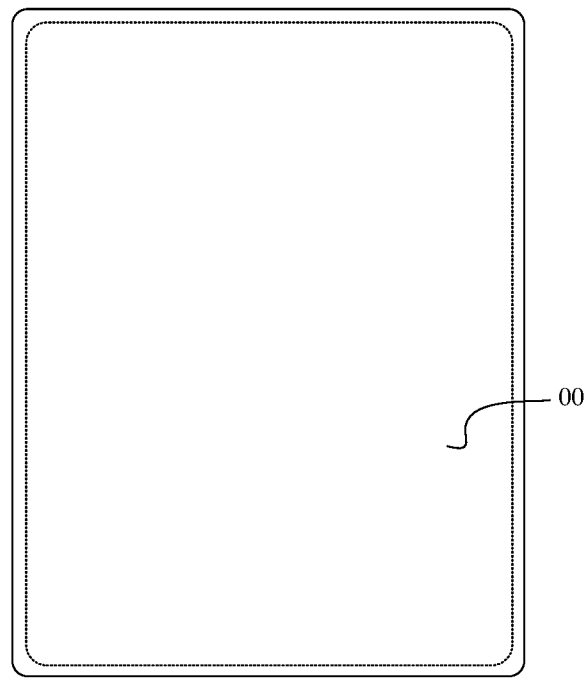
FIG. 25 is a schematic view of a display device according to an embodiment of the present disclosure.

Embodiments of the present disclosure also provide a display device. FIG. 25 shows a schematic view of a display device according to an embodiment of the present disclosure. As shown in FIG. 25, the display device includes the display panel 00 according to any one of the embodiments of the present disclosure as described above. The structure of the display panel has been described in the above embodiments, and the details thereof will be omitted herein. The display device in the embodiment of the present disclosure may be any device having a display function, such as a mobile phone, a tablet computer, a notebook computer, an electronic paper book, a television, and a smart wearable product.

Some embodiments of the present disclosure have been described above and the present disclosure is not intended to be limited thereto. Any modification, equivalent replacement, improvement and the like made within the spirit and principle of the present disclosure shall fall within the scope of the present disclosure.

Finally, it should be noted that the above embodiments are only illustrative for the technical solutions of the present disclosure, rather than limiting the present disclosure. Although the present disclosure has been described in detail with reference to the foregoing embodiments, it would be appreciated by those skilled in the art that the technical solutions as described in the foregoing embodiments can be modified, or some or all of the technical features are equivalently replaced. These modifications or replacements shall not depart from the scope of the technical solutions of the embodiments of the present disclosure.

What is claimed is:

1. A display panel, comprising:
   a pixel array comprising a plurality of subpixels, each subpixel comprising at least one light-emitting diode that comprises a first electrode and a second electrode; and
   an array substrate comprising a first power supply structure configured to provide a first power supply voltage, a second power supply structure configured to provide a second power supply voltage, and a plurality of pixel circuits,
   wherein the first power supply structure is electrically connected to the first electrode of the at least one light-emitting diode by a pixel circuit of the plurality of pixel circuits, and the second power supply structure is electrically connected to the second electrode of the at least one light-emitting diode,
   wherein at least one of the first power supply structure and the second power supply structure comprises at least one common electrode,
   wherein the display panel further comprises a display region having an area of $S_0$, and an area of an orthographic projection of a portion of the at least one common electrode in the display region on a plane of the display panel is defined as $S_1$, where $S_1 \geq 0.5 S_0$,
   wherein the first power supply structure comprises the at least one common electrode that is configured to be a first common electrode, and the first common electrode is arranged at a side of the plurality of pixel circuits that is close to the pixel array, wherein the array substrate further comprises a plurality of first auxiliary electrodes arranged in the same layer as the first common electrode, and each first auxiliary electrode is insulated from the first common electrode, wherein each of the plurality of pixel circuits comprises a transistor that comprises a first electrode, a second electrode and a control electrode, and the first electrode of the transistor is electrically connected to the first electrode of the at least one light-emitting diode by the first auxiliary electrode, wherein the array substrate further comprises a plurality of second auxiliary electrodes arranged in the same layer as the first common electrode, and each second auxiliary electrode is insulated from the first common electrode, and wherein the second power supply structure is electrically connected to the second electrode of the at least one light-emitting diode by the second auxiliary electrode.

2. The display panel according to claim 1, wherein the first common electrode has a plurality of first openings penetrating through the first common electrode in a thickness direction of the first common electrode, and at least one of the plurality of first auxiliary electrodes is disposed in each first opening.

3. The display panel according to claim 2, wherein the first common electrode comprises at least two first openings arranged in a third direction; and a ratio of a length of a portion of the first common electrode between two adjacent first openings in the third direction to a length of each first opening in the third direction is defined as R, where R≥3/7.

4. The display panel according to claim 1, wherein the first power supply structure further comprises a first power supply line electrically connected to the first common electrode, and the first power supply line is located in the same layer as the first electrode of the transistor; or the first common electrode comprises at least two first sub-common electrodes laminated and electrically connected to each other, and an insulation layer is provided between two adjacent first sub-common electrodes.

5. The display panel according to claim 1, wherein: the first auxiliary electrode is reused as a first binding electrode, the first electrode of the at least one light-emitting diode is bound to the first auxiliary electrode, and the second auxiliary electrode is reused as a second binding electrode, and the second electrode of the at least one light-emitting diode is bound to the second auxiliary electrode; or the array substrate further comprises:
an electrode connection layer disposed between the first common electrode and the at least one light-emitting diode; and
a first insulation layer disposed between the first common electrode and the electrode connection layer, wherein the electrode connection layer comprises a first connection electrode and a second connection electrode, wherein the first auxiliary electrode is electrically connected to the first electrode of the at least one light-emitting diode by the first connection electrode, and the second auxiliary electrode is electrically connected to the second electrode of the at least one light-emitting diode by the second connection electrode, and wherein the first connection electrode is bound to the first electrode of the at least one light-emitting diode, and the second connection electrode is bound to the second electrode of the at least one light-emitting diode.

6. The display panel according to claim 1, wherein: the second power supply structure comprises the at least one common electrode that is configured to be a second common electrode, the second common electrode is disposed between the first common electrode and the plurality of pixel circuits, and the array substrate further comprises a plurality of third auxiliary electrodes arranged in the same layer as the second common electrode, wherein the first common electrode is electrically connected to the pixel circuits by the third auxiliary electrodes; or the second power supply structure is arranged at a side of the first common electrode away from the at least one light-emitting diode, and comprises a plurality of second power supply lines located in the same layer as the first electrode of the transistor.

7. The display panel according to claim 1, wherein: the second power supply structure comprises a second upper power supply electrode and a second lower power supply electrode electrically connected to each other;

the second upper power supply electrode is disposed between the first common electrode and the at least one light-emitting diode; and the second lower power supply electrode comprises a plurality of second power supply lines located in the same layer as the first electrode of the transistor.

8. The display panel according to claim 1, wherein one of the plurality of subpixels comprises at least two light-emitting diodes that are connected to the same first auxiliary electrode.

9. The display panel according to claim 1, wherein: the at least one light-emitting diode further comprises a first semiconductor layer, a quantum well layer and a second semiconductor layer that are laminated to each other, and the quantum well layer is disposed between the first semiconductor layer and the second semiconductor layer;

the first electrode is connected to the first semiconductor layer, and the second electrode is connected to the second semiconductor layer; and the first semiconductor layer is arranged at a side of the second semiconductor layer close to the plurality of pixel circuits, the first electrode is arranged at a side of the first semiconductor layer close to the plurality of pixel circuits, and the second electrode is arranged at the side of the second semiconductor layer close to the plurality of pixel circuits; or the first semiconductor layer is arranged at a side of the second semiconductor layer close to the plurality of pixel circuits, the first electrode is arranged at a side of the first semiconductor layer close to the plurality of pixel circuits, and the second electrode is arranged at a side of the second semiconductor layer away from the plurality of pixel circuits; or the first semiconductor layer is arranged at a side of the second semiconductor layer away from the plurality of pixel circuits, the first electrode is arranged at a side of the first semiconductor layer away from the plurality of pixel circuits, and the second electrode is arranged at the side of the second semiconductor layer away from the plurality of pixel circuits.

10. The display panel according to claim 1, wherein the at least one common electrode further comprises a plurality of fourth openings that are filled with an insulation layer in direct contact with the at least one common electrode.

11. The display panel according to claim 1, wherein: the pixel array comprises a plurality of subpixel rows extending in a first direction and a plurality of subpixel columns extending in a second direction, and the second direction is intersected with the first direction; and the at least one common electrode comprises a plurality of strip electrodes extending in the first direction and arranged in the second direction in the display region or extending in the second direction and arranged in the first direction in the display region.

12. The display panel according to claim 1, wherein: each of the plurality of first openings corresponds to n subpixels of the plurality of subpixels, where n is an integer greater than 1; and wherein n first auxiliary electrodes of the plurality of first auxiliary electrodes are disposed in each first opening.

13. A display panel, comprising:

a pixel array comprising a plurality of subpixels, each subpixel comprising at least one light-emitting diode that comprises a first electrode and a second electrode; and an array substrate comprising a first power supply structure configured to provide a first power supply voltage, a second power supply structure configured to provide a second power supply voltage, and a plurality of pixel circuits, wherein the first power supply structure is electrically connected to the first electrode of the at least one light-emitting diode by a pixel circuit of the plurality of pixel circuits, and the second power supply structure is electrically connected to the second electrode of the at least one light-emitting diode, wherein at least one of the first power supply structure and the second power supply structure comprises at least one common electrode, wherein the display panel further comprises a display region having an area of $S_0$, and an area of an orthographic projection of a portion of the at least one common electrode in the display region on a plane of the display panel is defined as $S_1$, where $S_1 \geq 0.5 S_0$, wherein the first power supply structure comprises the at least one common electrode that is configured to be a first common electrode, and the first common electrode is arranged at a side of the plurality of pixel circuits that is close to the pixel array, wherein the array substrate further comprises a plurality of first auxiliary electrodes arranged in the same layer as the first common electrode, and each first auxiliary electrode is insulated from the first common electrode, wherein each of the plurality of pixel circuits comprises a transistor that comprises a first electrode, a second electrode and a control electrode, and the first electrode of the transistor is electrically connected to the first electrode of the at least one light-emitting diode by the first auxiliary electrode, and wherein the second power supply structure is disposed between the first common electrode and the at least one light-emitting diode.

14. The display panel according to claim 13, wherein the second power supply structure comprises the at least one common electrode that is configured to be a second common electrode.

15. The display panel according to claim 14, wherein the array substrate further comprises a plurality of fourth auxiliary electrodes arranged in the same layer as the second common electrode; and the first auxiliary electrode is electrically connected to the first electrode of the at least one light-emitting diode by the plurality of fourth auxiliary electrodes.

16. The display panel according to claim 15, wherein the second common electrode is provided with a plurality of second openings penetrating through the second common electrode in a thickness direction of the second common electrode, and one of the plurality of fourth auxiliary electrodes is disposed in one of the plurality of second openings.

17. The display panel according to claim 14, wherein: the second common electrode overlaps with the first common electrode in a direction perpendicular to the plane of the array substrate; and an area of an overlapping portion of the second common electrode and the first common electrode in the display region is defined as $S_2$, and an area of an orthographic projection of a portion of the second common electrode in the display region on the plane of the display panel is defined as $S_3$, where $S_2 \geq 0.5 S_3$.

18. The display panel according to claim 13, wherein the array substrate further comprises a binding layer, and the second power supply structure is arranged in the binding layer and is bound to the second electrode of the at least one light-emitting diode.

19. The display panel according to claim 13, wherein the array substrate further comprises:

an electrode connection layer arranged at a side of the second power supply structure away from the first common electrode; and a second insulation layer disposed between the second power supply structure and the electrode connection layer, wherein the electrode connection layer comprises a first connection electrode and a second connection electrode, and wherein the first auxiliary electrode is electrically connected to the first electrode of the at least one light-emitting diode by the first connection electrode, and the second power supply structure is electrically connected to the second electrode of the at least one light-emitting diode by the second connection electrode.

20. A display device, comprising a display panel, the display panel comprising:

a pixel array comprising a plurality of subpixels, each subpixel comprising at least one light-emitting diode that comprises a first electrode and a second electrode; and an array substrate comprising a first power supply structure configured to provide a first power supply voltage, a second power supply structure configured to provide a second power supply voltage, and a plurality of pixel circuits, wherein the first power supply structure is electrically connected to the first electrode of the at least one light-emitting diode by a pixel circuit of the plurality of pixel circuits, and the second power supply structure is electrically connected to the second electrode of the at least one light-emitting diode, wherein at least one of the first power supply structure and the second power supply structure comprises at least one common electrode, wherein the display panel further comprises a display region having an area of $S_0$, and an area of an orthographic projection of a portion of the at least one common electrode in the display region on a plane of the display panel is defined as $S_1$, where $S_1 \geq 0.5 S_0$, wherein the first power supply structure comprises the at least one common electrode that is configured to be a first common electrode, and the first common electrode is arranged at a side of the plurality of pixel circuits that is close to the pixel array;

wherein the array substrate further comprises a plurality of first auxiliary electrodes arranged in the same layer as the first common electrode, and each first auxiliary electrode is insulated from the first common electrode;

wherein each of the plurality of pixel circuits comprises a transistor that comprises a first electrode, a second electrode and a control electrode, and the first electrode of the transistor is electrically connected to the first electrode of the at least one light-emitting diode by the first auxiliary electrode;

wherein the array substrate further comprises a plurality of second auxiliary electrodes arranged in the same layer as the first common electrode, and each second auxiliary electrode is insulated from the first common electrode; and wherein the second power supply structure is electrically connected to the second electrode of the at least one light-emitting diode by the second auxiliary electrode.

* * * * *